(12) United States Patent
Lee et al.

(10) Patent No.: US 9,287,401 B2
(45) Date of Patent: Mar. 15, 2016

(54) SEMICONDUCTOR DEVICE HAVING FIN-TYPE FIELD EFFECT TRANSISTOR AND METHOD OF MANUFACTURING THE SAME

(71) Applicant: Samsung Electronics Co., Ltd., Suwon-si (KR)

(72) Inventors: Jae-Hwan Lee, Seoul (KR); Sangsu Kim, Yongin-si (KR); Changjae Yang, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/469,615

(22) Filed: Aug. 27, 2014

(65) Prior Publication Data

US 2015/0137263 A1 May 21, 2015

(30) Foreign Application Priority Data

Nov. 15, 2013 (KR) ........................ 10-2013-0139160

(51) Int. Cl.
*H01L 21/76* (2006.01)
*H01L 29/78* (2006.01)
*H01L 29/66* (2006.01)

(52) U.S. Cl.
CPC ........ *H01L 29/785* (2013.01); *H01L 29/66795* (2013.01)

(58) Field of Classification Search
CPC .............. H01L 21/76; H01L 21/76205; H01L 21/76224
See application file for complete search history.

(56) References Cited

U.S. PATENT DOCUMENTS

| | | | |
|---|---|---|---|
| 5,447,884 A | 9/1995 | Fahey et al. | |
| 6,140,208 A | 10/2000 | Agahi et al. | |
| 6,960,818 B1 | 11/2005 | Rengarajan et al. | |
| 6,963,094 B2 | 11/2005 | Lee et al. | |
| 7,148,541 B2 * | 12/2006 | Park et al. | H01L 27/01 257/347 |
| 7,785,993 B2 | 8/2010 | Pawlak et al. | |
| 8,361,852 B2 | 1/2013 | Jeong | |
| 2003/0222294 A1 | 12/2003 | Yoshino | |
| 2006/0118876 A1* | 6/2006 | Lee et al. | 257/365 |
| 2009/0111238 A1* | 4/2009 | Kim | H01L 21/76224 438/425 |
| 2013/0043536 A1* | 2/2013 | Rahim et al. | 257/347 |
| 2013/0052813 A1 | 2/2013 | Yeh et al. | |
| 2014/0264592 A1* | 9/2014 | Oxland et al. | 257/347 |
| 2015/0102385 A1* | 4/2015 | Fung | 257/190 |

FOREIGN PATENT DOCUMENTS

| | | |
|---|---|---|
| JP | 2003-347437 | 12/2003 |
| KR | 10-2003-0048959 A | 6/2003 |
| KR | 10-2005-0067008 A | 6/2005 |
| KR | 10-2006-0102672 A | 9/2006 |
| KR | 10-2011-0064872 A | 6/2011 |

OTHER PUBLICATIONS

Olsen et al., "Strain characterisation in advanced Si devices." University of Newcastle. Date unknown.

* cited by examiner

*Primary Examiner* — Jae Lee
(74) *Attorney, Agent, or Firm* — Muir Patent Law, PLLC

(57) ABSTRACT

A field effect transistor includes a fin structure, having a sidewall, protruding from a substrate, and a device isolation structure on the substrate, the device isolation structure defining the sidewall of the fin structure, wherein the fin structure includes a buffer semiconductor pattern disposed on the substrate and a channel pattern disposed on the buffer semiconductor pattern, wherein the buffer semiconductor pattern has a lattice constant different from that of the channel pattern, and wherein the device isolation structure includes a gap-fill insulating layer, and includes an oxidation blocking layer pattern disposed between the buffer semiconductor pattern and the gap-fill insulating layer.

19 Claims, 29 Drawing Sheets

800

SEMICONDUCTOR DEVICE HAVING FIN-TYPE FIELD EFFECT TRANSISTOR AND METHOD OF MANUFACTURING THE SAME

CROSS-REFERENCE TO RELATED APPLICATIONS

This U.S. non-provisional patent application claims priority under 35 U.S.C. §119 to Korean Patent Application No. 10-2013-0139160, filed on Nov. 15, 2013 in the Korean Intellectual Property Office (KIPO), the contents of which are herein incorporated by reference in their entirety.

BACKGROUND

Nowadays, a semiconductor device is very widely used in electronic industries because it has many beneficial characteristics, for example, a possibility of miniaturization, a multi-functional ability, and a lower manufacturing cost, etc. Semiconductor devices may be classified by several devices, for example, a memory device which can store logical data, a logic device which can operate the logical data, and/or a hybrid device which can perform various functions, in some cases simultaneously.

In the rapidly developing electronics industry, demand for a high reliability and a multi-functional ability has been increasing for semiconductor devices. In order to meet this demand, the structure of semiconductor devices has been getting more complex and the size of the semiconductor devices has been highly miniaturized.

SUMMARY

An aspect of the present inventive concepts provides a field effect transistor having a fin structure and a device isolation structure. The device isolation structure may have a gap-fill insulating layer and an oxidation blocking layer pattern. Another aspect of the present inventive concepts provides a semiconductor device having said fin-type field effect transistor and a method of manufacturing the same.

In one example embodiment, the field effect transistor includes a fin structure, having a sidewall, protruding from a substrate, and a device isolation structure on the substrate, the device isolation structure defining the sidewall of the fin structure, wherein the fin structure includes a buffer semiconductor pattern disposed on the substrate and a channel pattern disposed on the buffer semiconductor pattern, wherein the buffer semiconductor pattern has a lattice constant different from that of the channel pattern, and wherein the device isolation structure includes a gap-fill insulating layer, and includes an oxidation blocking layer pattern disposed between the buffer semiconductor pattern and the gap-fill insulating layer.

In some embodiments, the buffer semiconductor pattern may have an oxidation rate greater than that of the channel pattern.

In some embodiments, an uppermost surface of the oxidation blocking layer pattern may be at a level higher than that of an uppermost surface of the buffer semiconductor pattern, but lower than that of an uppermost surface of the fin structure.

In some embodiments, the uppermost surface of the oxidation blocking layer pattern is at substantially the same level as the uppermost surface of the gap-fill insulating layer.

In some embodiments, the device isolation structure may further include a buffer oxide layer pattern between the oxidation blocking layer pattern and the buffer semiconductor pattern.

In some embodiments, the oxidation blocking layer pattern may have a density denser than that of the buffer oxide layer pattern.

In some embodiments, the oxidation blocking layer pattern may include nitrogen (N).

In some embodiments, the buffer oxide layer pattern may have a density denser than that of the gap-fill insulating layer.

In some embodiments, the oxidation blocking layer pattern may have a thickness thinner than that of the buffer oxide layer pattern.

In some embodiments, the buffer semiconductor pattern may include two portions. The two portions may comprise an upper portion comprising a lower portion of the fin structure, and a lower portion disposed between the upper portion of the buffer semiconductor pattern and the substrate, wherein the buffer oxide layer pattern extends along the sidewall of the upper portion of the buffer semiconductor pattern and the upper surface of the lower portion of the buffer semiconductor pattern.

In some embodiments, the oxidation blocking layer pattern may contact the sidewall of the buffer semiconductor pattern.

In some embodiments, the oxidation blocking layer pattern may have a spacer shape and is formed on the sidewall of the buffer semiconductor pattern.

In some embodiments, the device isolation structure may pass downwardly through the buffer semiconductor pattern into the substrate.

In some embodiments, the field effect transistor may further comprise a gate dielectric layer on the fin structure and on the uppermost surface of the oxidation blocking layer pattern, and a gate electrode on the gate dielectric layer.

In some embodiments, the gate dielectric layer may have a high-k dielectric constant, wherein the gate electrode includes metal.

In accordance with another aspect of the embodiments, a semiconductor device includes: a first fin structure, having a first sidewall and second sidewall, the first fin structure protruding from a substrate; a first device isolation structure on the substrate, the first device isolation structure defining the first sidewall of the first fin structure; and a second device isolation structure on the substrate, the second device isolation structure defining the second sidewall of the first fin structure. The first fin structure may include a first buffer semiconductor pattern disposed on the substrate and a first channel pattern disposed on the first buffer semiconductor pattern. The first buffer semiconductor pattern may have a lattice constant different from that of the channel pattern. The first device isolation structure may include a first gap-fill insulating layer, and include a first oxidation blocking layer pattern disposed between the first buffer semiconductor pattern and the first gap-fill insulating layer.

In certain embodiments, the semiconductor includes at least a second fin structure, having a third sidewall and fourth sidewall, the second fin structure protruding from the substrate, wherein the third sidewall is defined by the first device isolation structure. The second fin structure may include a second buffer semiconductor pattern disposed on the substrate and a second channel pattern disposed on the second buffer semiconductor pattern, and the second buffer semiconductor pattern may have the same lattice constant as the first buffer semiconductor pattern.

In one embodiment, the first fin structure, second fin structure, first device isolation structure, and second device isolation structure form part of a field effect transistor.

In accordance with another aspect of the present inventive concepts, a field effect transistor may include a plurality of fin structures protruding from a substrate, and a plurality of device isolation structures in a plurality of trenches, each trench disposed between two of the plurality of the fin structures, wherein each of the plurality of fin structures includes a channel pattern disposed on the substrate and a buffer semiconductor pattern disposed between the channel pattern and the substrate, the buffer semiconductor pattern having an oxidation rate greater than that of the channel pattern, wherein each of the plurality of device isolation structures includes a buffer oxide layer pattern, an oxidation blocking layer pattern, and a gap-fill insulating layer, and wherein the oxidation blocking layer pattern has a density denser than that of the buffer oxide layer pattern.

In some embodiments, the uppermost surface of the oxidation blocking layer pattern may be at a level higher than that of the uppermost surface of the buffer semiconductor pattern, but lower than that of the uppermost surfaces of the fin structures.

In some embodiments, the uppermost surface of the oxidation blocking layer pattern may be at substantially the same level as the uppermost surface of the gap-fill insulating layer.

In some embodiments, the oxidation blocking layer pattern may include nitrogen (N).

In some embodiments, the oxidation blocking layer pattern may have a thickness thinner than that of the buffer oxide layer pattern.

In accordance with still another aspect of the present inventive concepts, the semiconductor device may include a first transistor having a plurality of first fin structures protruding from a substrate and a first device isolation structure disposed between two of the first fin structures, and a second transistor having a plurality of second fin structures protruding from the substrate and a second device isolation structure disposed between two of the second fin structures, wherein each one of the first and second fin structures includes a channel pattern and a buffer semiconductor pattern disposed between the channel pattern and the substrate, respectively, wherein each one of the first and second device isolation structures includes a gap-fill insulating layer, respectively, and wherein at least one of the first and second device isolation structures includes an oxidation blocking layer pattern between the buffer semiconductor pattern and the gap-fill insulating layer.

In some embodiments, the buffer semiconductor pattern disposed in at least one of the first and second fin structures may have an oxidation rate greater than that of the channel pattern for that fin structure.

In some embodiments, an uppermost surface of the oxidation blocking layer pattern is at a level higher than that of the uppermost surface of the buffer semiconductor pattern, but lower than those of the uppermost surfaces of the first and second fin structures.

In some embodiments, the uppermost surface of the oxidation blocking layer pattern is at substantially the same level as the uppermost surface of the gap-fill insulating layer.

In some embodiments, the oxidation blocking layer pattern may include nitrogen (N).

In some embodiments, the semiconductor device may further comprise a buffer oxide layer pattern disposed between the oxidation blocking layer pattern and the respective buffer semiconductor pattern, wherein the oxidation blocking layer pattern has a thickness thinner than that of the buffer oxide layer pattern.

In some embodiments, the buffer semiconductor pattern of the first transistor may have a first lattice constant greater than that of the channel pattern of the first transistor, and wherein the buffer semiconductor pattern of the second transistor has a second lattice constant less than that of the channel pattern of the second transistor.

In some embodiments, the first lattice constant may be different from the second lattice constant.

In accordance with still another aspect of the present inventive concepts, a method of manufacturing a semiconductor device may include forming a fin structure protruding from a substrate, the fin structure including a buffer semiconductor pattern and a channel pattern disposed on the buffer semiconductor pattern, forming an oxidation blocking layer on a sidewall of the fin structure, forming a preliminary gap-fill insulating layer on the oxidation blocking layer by using a flowable chemical vapor deposition (FCVD) process, and annealing the preliminary gap-fill insulating layer to form a gap-fill insulating layer on the oxidation blocking layer.

In some embodiments, the buffer semiconductor pattern may have an oxidation rate greater than that of the channel pattern.

In some embodiments, the method may further include forming a buffer oxide layer on a sidewall of the fin structure by using a thermal oxidation process before forming the oxidation blocking layer.

In some embodiments, a portion of the buffer oxide layer may be nitrided when annealing the preliminary gap-fill insulating layer.

In some embodiments, the annealing of the preliminary gap-fill insulating layer may be performed by using at least one process selected from the group consisting of a wet annealing process in a temperature range of about 500° C. to about 700° C. and a nitrogen annealing process in a temperature range of about 600° C. to a bout 800° C.

In some embodiments, the method may further include recessing the gap-fill insulating layer to expose a portion of the oxidation blocking layer, and removing the exposed portion of the oxidation blocking layer to form a oxidation blocking layer pattern.

In some embodiments, the forming of the preliminary gap-fill insulating layer may includes injecting a gas mixture containing a first precursor and a second precursor into a processing chamber, and wherein the first precursor includes silicon (Si) and the second precursor includes at least one selected from the group consisting of nitrogen, hydrogen, oxygen, and a mixture thereof.

In some embodiments, the oxidation blocking layer may obstruct oxygen movement from the preliminary gap-fill insulating layer to the buffer semiconductor pattern during the annealing step.

BRIEF DESCRIPTION OF THE DRAWINGS

The foregoing and other features and advantages of the inventive concepts will be apparent from the more particular description of the example embodiments, as illustrated in the accompanying drawings in which like reference characters refer to the same or similar parts throughout the different views. The drawings are not necessarily to scale, emphasis instead being placed upon illustrating the principles of the inventive concepts.

FIGS. 2, 3, and 4a through 12a are perspective views illustrating a method of manufacturing a semiconductor device including a transistor according to an example embodiment of the inventive concepts.

FIGS. 4b through 12b are cross-sectional views corresponding to line A-A' of FIGS. 4a through 12a.

FIGS. 4c through 12c are cross-sectional views corresponding to line B-B' of FIGS. 4a through 12a.

DETAILED DESCRIPTION

Figure 1:
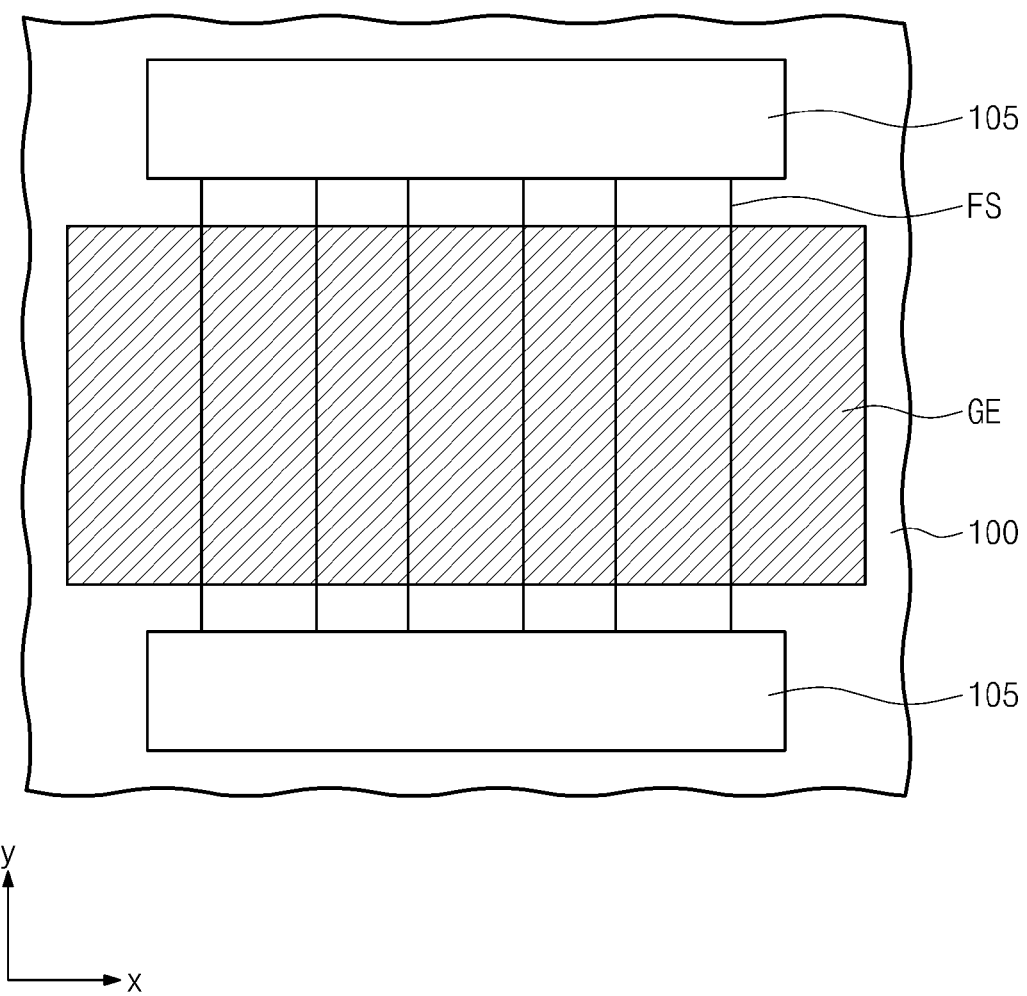
FIG. 1 is a plan view illustrating a semiconductor device including a transistor according to an example embodiment of the inventive concepts.

Example embodiments of the inventive concepts will now be described more fully hereinafter with reference to the accompanying drawings; however, they may be embodied in different forms and should not be construed as limited to the example embodiments set forth herein.

It will be understood that when an element is referred to as being "on," "connected" or "coupled" to another element, it can be directly on, connected or coupled to the other element or intervening elements may be present. In contrast, when an element is referred to as "contacting," or being "directly on," "directly connected" or "directly coupled" to another element, there are no intervening elements present. Other words used to describe the relationship between elements or layers should be interpreted in a like fashion (e.g., "between" versus "directly between," "adjacent" versus "directly adjacent," "under" versus "directly under").

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

In the figures, the dimensions of layers and regions may be exaggerated for clarity of illustration.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the term "and/or" includes any and all combinations of one or more of the associated listed items. The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or exemplary terms provided herein is intended merely to better illuminate the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of the inventive concepts will be described in detail with reference to the accompanying drawings.

FIG. 1 is a plan view illustrating a semiconductor device including a transistor according to an example embodiment of the inventive concepts. FIGS. 2, 3, and 4a through 12a are perspective views illustrating a method of manufacturing a semiconductor device including a transistor according to an example embodiment of the inventive concepts. FIGS. 4b through 12b are cross-sectional views corresponding to line A-A' of FIGS. 4a through 12a. FIGS. 4c through 12c are cross-sectional views corresponding to line B-B' of FIGS. 4a through 12a.

Figure 2:
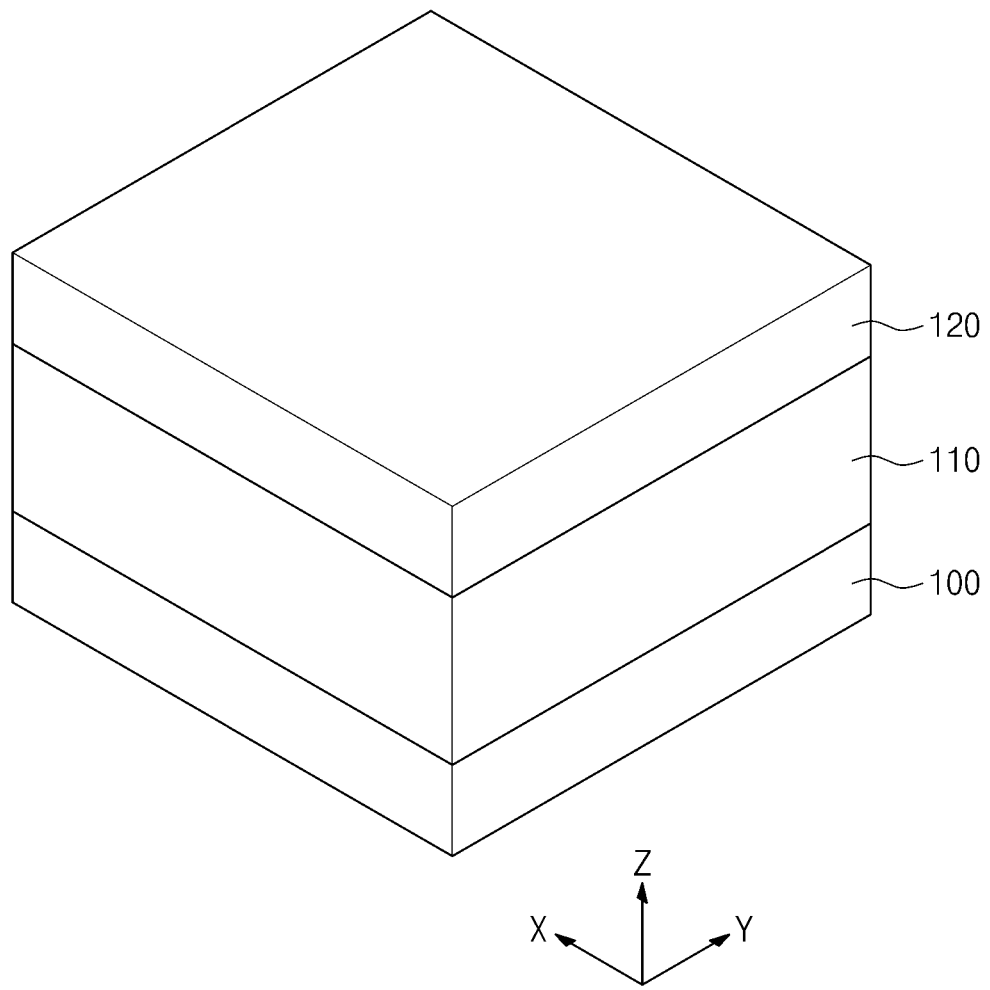

Referring to FIGS. 1 and 2, a buffer semiconductor layer 110 and a channel layer 120 are successively formed on a substrate 100. The substrate 100 may include a bulk silicon substrate or a silicon-on-insulator (SOI) substrate. For example, the substrate 100 may include silicon (Si), germanium GE, silicon germanium (SiGe), indium antimonide (InSb), lead telluride (PbTe), indium arsenide (InAs), indium phosphide (InP), gallium arsenide (GaAs), and/or gallium antimonide (GaSb). The buffer semiconductor layer 110 may have thickness thicker than that of the channel layer 120.

The buffer semiconductor layer 110 may have a lattice constant different from that of the channel layer 120. For example, if a field effect transistor (FET) according to an example embodiment of the inventive concepts is a PMOS transistor, the buffer semiconductor layer 110 may have a lattice constant less than that of the channel layer 120. As the result, the buffer semiconductor layer 110 may induce a compressive stress into the channel layer 120 which is formed thereon. On the contrary, if the field effect transistor is a NMOS transistor, the buffer semiconductor layer 110 may have a lattice constant greater than that of the channel layer 120. As the result, the buffer semiconductor layer 110 may induce tensile stress into the channel layer 120.

The buffer semiconductor layer 110 may have an oxidation rate greater than that of the channel layer 120. For example, in one embodiment, the buffer semiconductor layer 110 includes silicon germanium ($Si_{1-x}Ge_x$) and the channel layer 120 includes silicon (Si) or silicon germanium ($Si_{1-y}Ge_y$, y<x) having a germanium concentration less than that of the buffer semiconductor layer 110. Therefore, in some embodiments, the germanium concentration of the buffer semiconductor layer 110 may be greater than that of the channel layer 120. Germanium (Ge) may weaken the bonding energy between silicon atoms in the silicon germanium (SiGe) layer. Therefore, if the concentration of germanium (Ge) is higher, the oxidation rate of the silicon germanium (SiGe) layer may be faster.

The buffer semiconductor layer 110 and the channel layer 120 may be formed on the substrate 100, for example, by using an epitaxial growth process, a chemical vapor deposition, or a molecular beam epitaxy process. In certain embodiments, the buffer semiconductor layer 110 has a thickness thicker than that of the channel layer 120.

Figure 3:
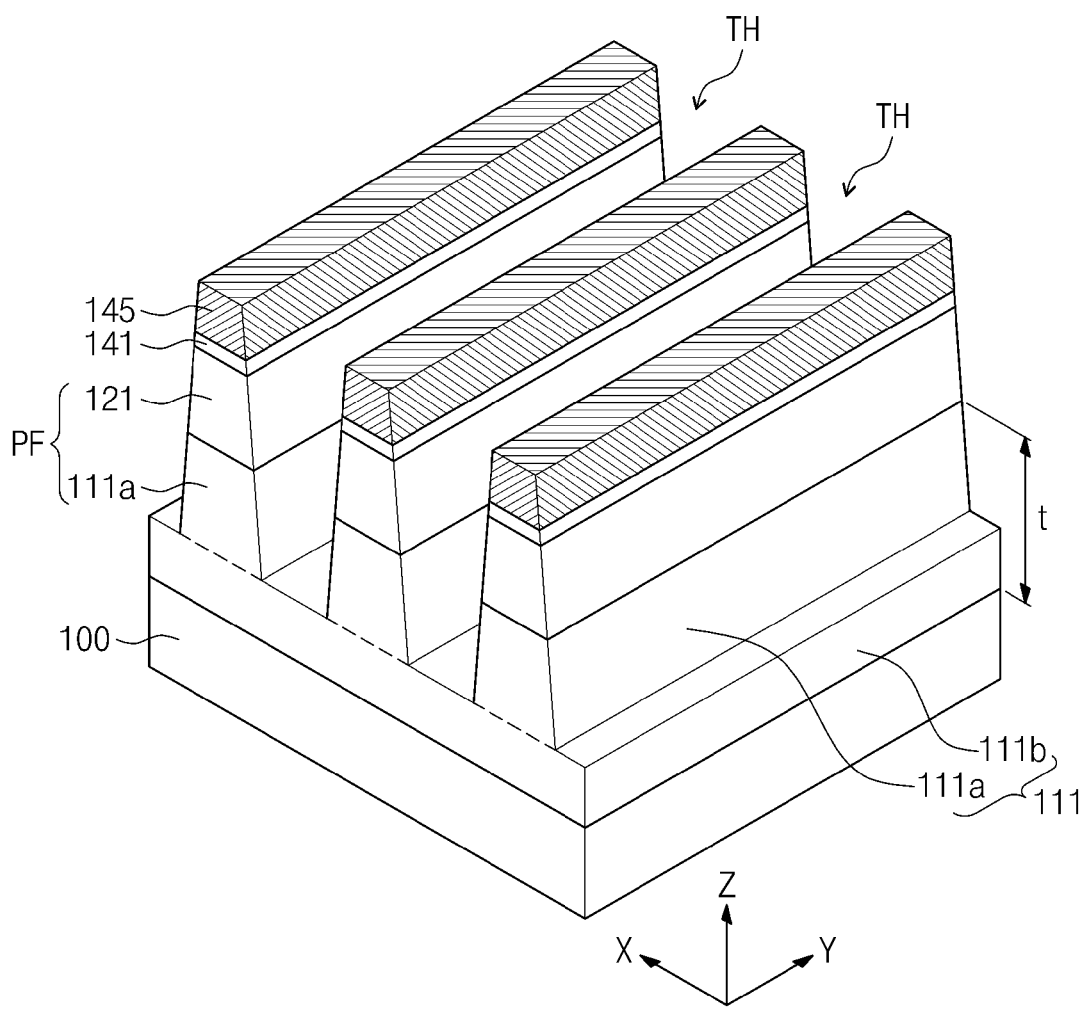
Figure 4A:
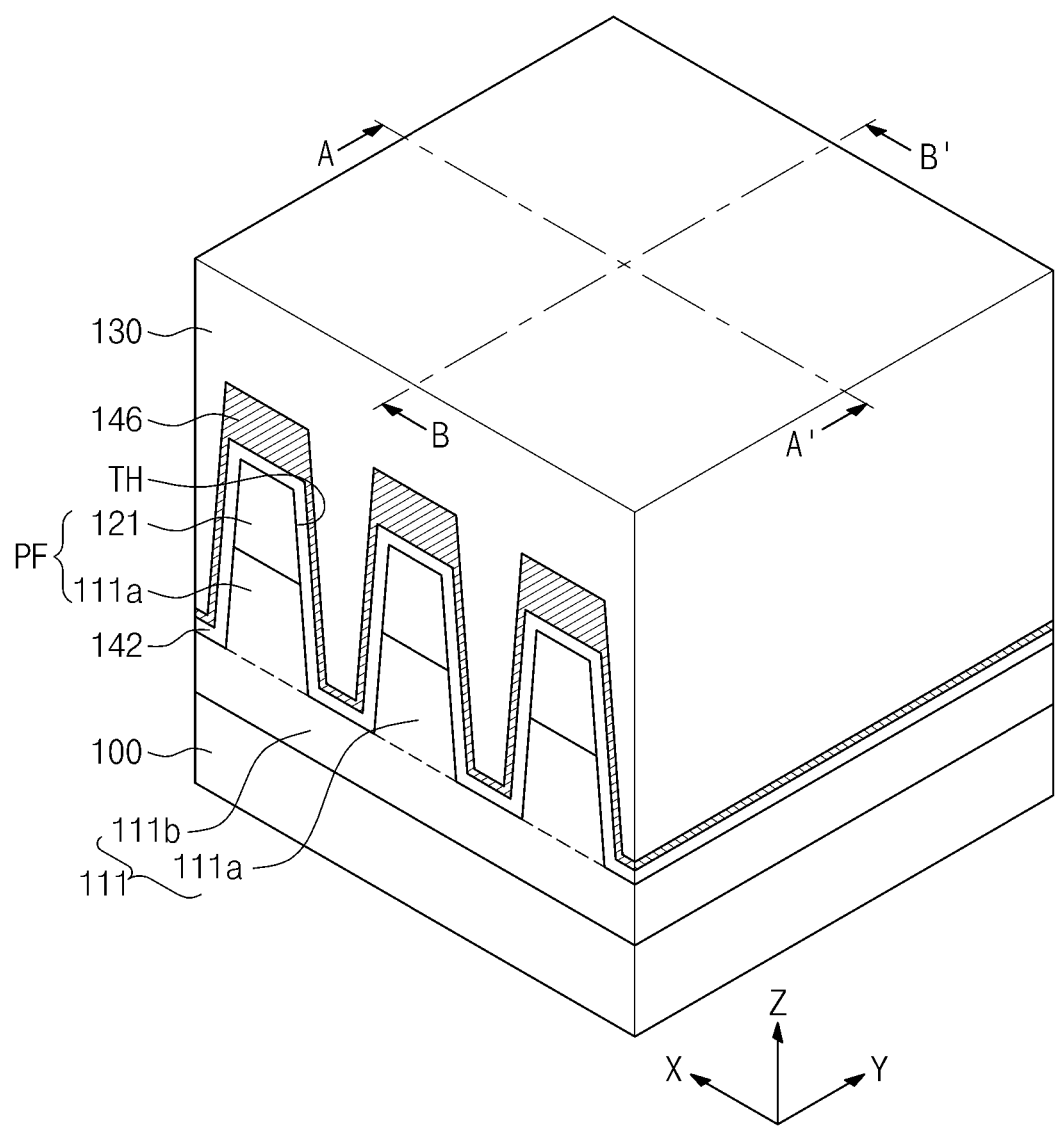
Figure 4B:
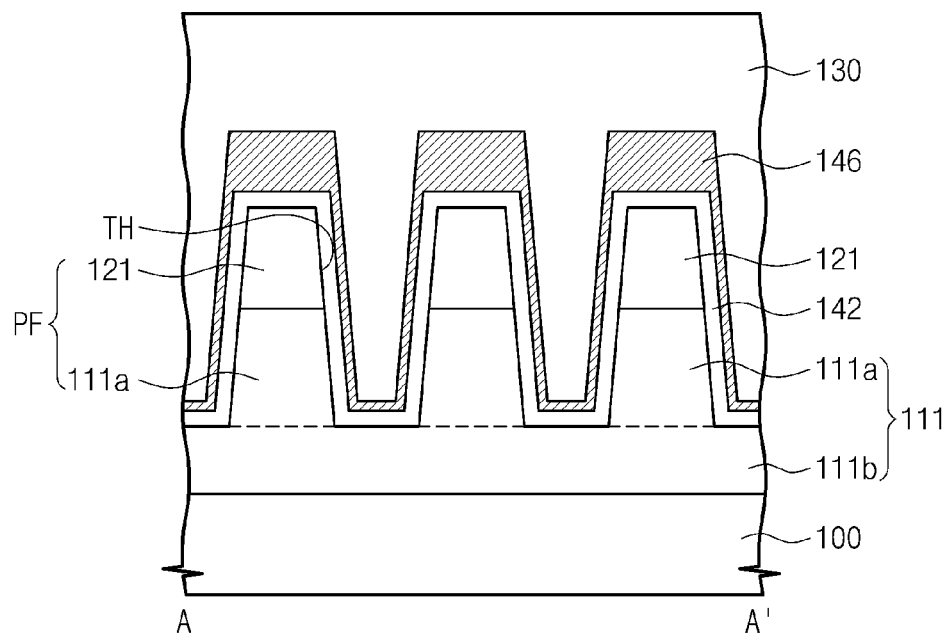
Figure 4C:
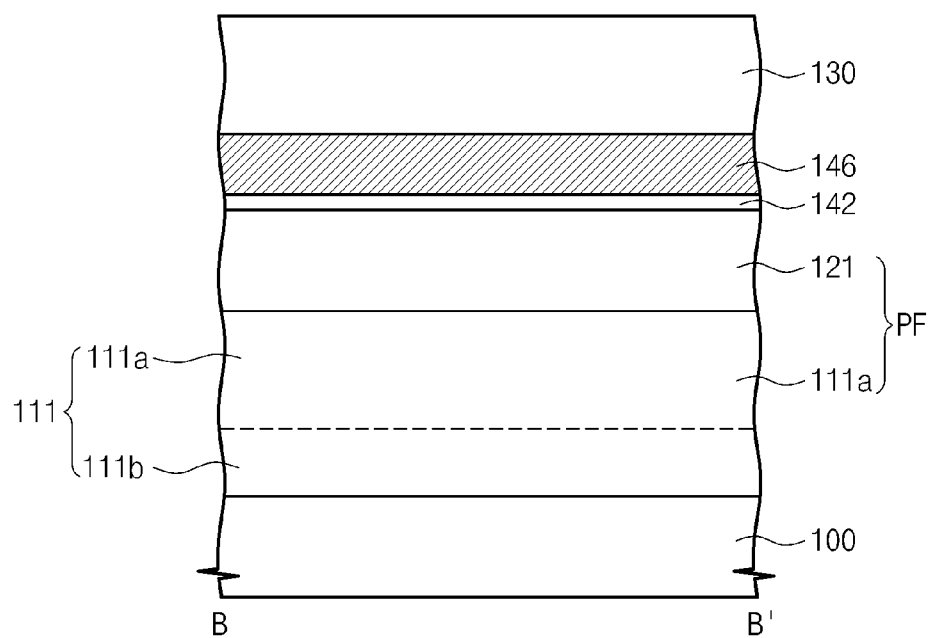
Figure 5A:
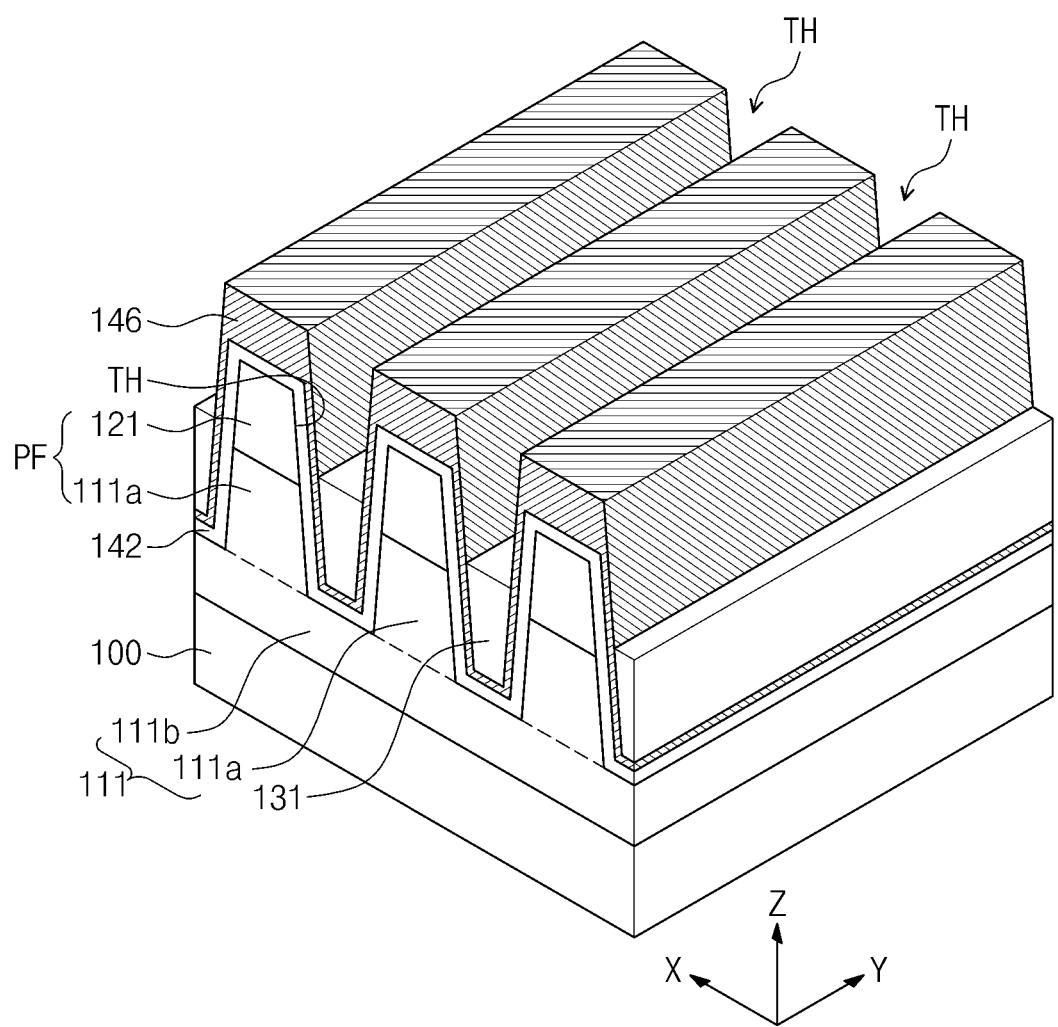
Figure 5B:
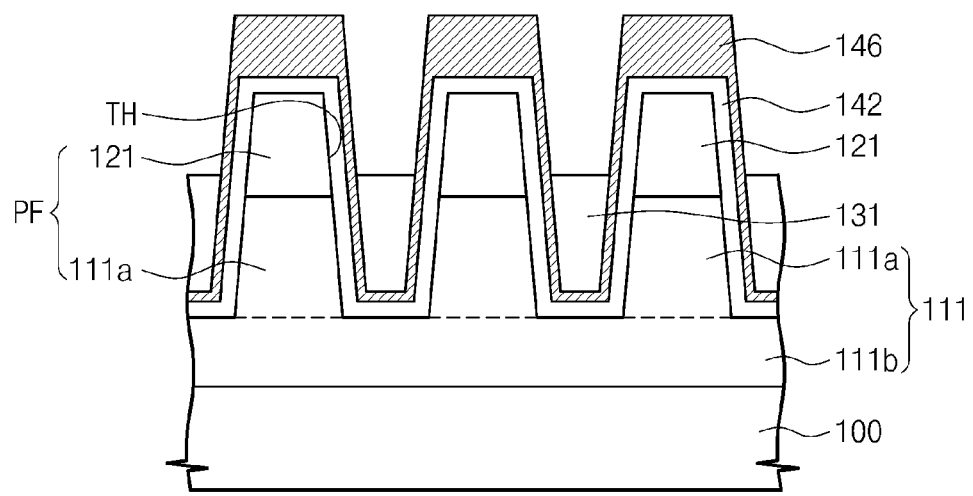
Figure 5C:
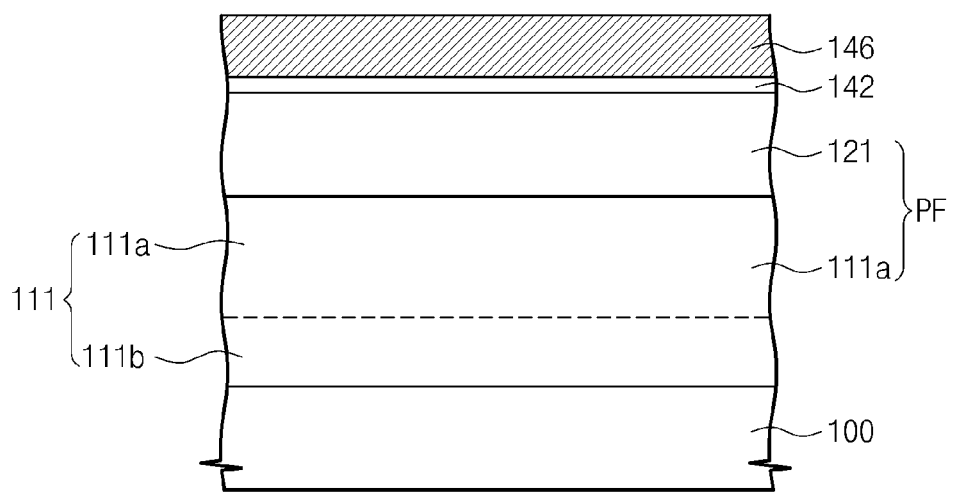

Referring to FIGS. 1 and 3, a pad oxide layer 141 and a mask pattern 145 may be formed on the channel layer 120. For example, the pad oxide layer 141 and the channel layer 120 may be etched by a dry etching process or a wet etching process using the mask pattern 145 as an etching mask. An upper portion of the buffer semiconductor layer 110 may be also etched. As the result, a plurality of preliminary channel patterns 121 and a buffer semiconductor pattern 111 is formed on the substrate 100. The buffer semiconductor pattern 111 may comprise a plurality of upper buffer semiconductor patterns 111a and a lower buffer semiconductor pattern 111b. A plurality of preliminary fin structures PF may be formed on the substrate 100. The plurality of preliminary fin structures PF may include the plurality of preliminary channel patterns 121 and the plurality of upper buffer semiconductor patterns 111a.

In one embodiment, the plurality of preliminary fin structures PF are separated by a plurality of trenches TH. The plurality of trenches TH may be defined by sidewalls of the preliminary channel patterns 121, sidewalls of the upper buffer semiconductor patterns 111a, and the upper surface of the lower buffer semiconductor pattern 111b.

The plurality of upper buffer semiconductor patterns 111a may be separated from each other by the plurality of trenches TH. The lower buffer semiconductor pattern 111b may contact the bottoms of the plurality of the upper buffer semiconductor patterns 111a. In certain embodiments, a bottom width of each of the plurality of trenches TH may be less than the half of the thickness ("t") of the buffer semiconductor patterns 111 (e.g., less than half of the thickness "t" between a bottom-most surface of the lower buffer semiconductor pattern 111b and a top-most surface of the upper buffer semiconductor pattern 111a). A cleaning process may be performed after forming the plurality of trenches TH.

Referring to FIGS. 1, and 4a through 4c, a buffer oxide layer 142 may be formed in the plurality of trenches TH. The buffer oxide layer 142 may be formed along the sidewalls of the preliminary fin structures PF and on the upper surface of the lower buffer semiconductor pattern 111b.

The buffer oxide layer 142 may be formed, for example, by using a thermal oxidation process. Therefore, the buffer oxide layer 142 may contact the pad oxide layer 141, and may be formed of substantially the same material as the pad oxide layer 141. For simplicity of description, from now on, the pad oxide layer 141 will be explained as a part of the buffer oxide layer 142.

During the thermal oxidation process, a heat treatment may be performed for releasing any stress induced into the preliminary fin structure PF and curing any damage induced into the sidewalls of the preliminary fin structure PF. The buffer oxide layer 142 may comprise, for example, at least one of a silicon oxide layer, a silicon germanium oxide layer, and/or a germanium oxide layer. An oxidation blocking layer 146 may be formed on the buffer oxide layer 142.

Optionally, the buffer oxide layer 142 may be omitted and the oxidation blocking layer 146 may be conformally formed along the sidewalls of the preliminary fin structures PF and on the upper surface of the lower buffer semiconductor pattern 111b which is exposed between the preliminary fin structures PF.

The oxidation blocking layer 146 may contact the mask pattern 145 and be formed of substantially the same material as the mask pattern 145. For simplicity of description, from now on, the mask pattern 145 will be explained as a part of the oxidation blocking layer 146.

In certain embodiments, the oxidation blocking layer 146 may have a density (e.g., mass per unit volume) denser than that of the buffer oxide layer 142. The oxidation blocking layer 146 may be formed of an insulating layer containing nitrogen. For example, the oxidation blocking layer 146 may comprise at least one of silicon nitride, silicon oxynitride, and silicon carbon nitride. On the contrary, the oxidation blocking layer 146 may not comprise nitrogen, but comprise, for example, silicon carbide. In one embodiment, the oxidation blocking layer 146 may be formed by a chemical vapor deposition.

The oxidation blocking layer 146 (e.g., the portion formed on sidewalls of the trenches and on a top surface of buffer oxide layer 142 in the trenches) may have a thickness thinner than that of the buffer oxide layer 142. For example, the oxidation blocking layer 146 may have a thickness of about 50% to about 80% of the thickness of the buffer oxide layer 142. For example, the buffer oxide layer 142 may have a thickness of about 3 nm and the oxidation blocking layer 146 may have a thickness of about 2 nm. If the thickness of the oxidation blocking layer 146 is less than about 50% of the thickness of the buffer oxide layer 142, it may not obstruct oxygen movement from outside into the upper buffer semiconductor patterns 111a. Therefore, the upper buffer semiconductor patterns 111a may be partially oxidized when forming a gap-fill insulating layer in the next step. On the contrary, if the thickness of the oxidation blocking layer 146 is greater than about 80% of the thickness of the buffer oxide layer 142, the gaps of the trenches TH would be smaller, therefore it may make difficult to fill the trenches TH without voids when forming a gap-fill insulating layer in the next step.

If the oxidation blocking layer 146 includes nitrogen, a portion of the buffer oxide layer 142 may be nitrided when forming the oxidation blocking layer 146 or forming a gap-fill insulating layer in the next step. In this case, the nitrided portion of the buffer oxide layer 142 may belong to a part of the oxidation blocking layer 146. The detailed descriptions will follow referring to FIG. 13.

A gap-fill insulating layer 130, filling the trenches TH, may be formed on the oxidation blocking layer 146. The gap-fill insulating layer 130 may include, for example, a silicon oxide layer. In one embodiment, the gap-fill insulating layer 130 may be formed by using a flowable chemical vapor deposition (FCVD) process. As the semiconductor device is highly integrated, the gap between the preliminary fin structures PF has become narrower therefore the process difficulty of forming the gap-fill insulating layer 130 between the preliminary fin structures PF has gradually increased. Especially if the gap between the preliminary fin structures PF is less than 40 nm, it can be very difficult to fill the gap, without voids, with the gap-fill insulating layer 130.

The FCVD process may be a useful process to fill narrower gaps. In one embodiment, the method of forming the gap-fill insulating layer 130 may comprise a first step of forming a preliminary gap-fill insulating layer by using a FCVD process and a second step of hardening the preliminary gap-fill insulating layer. The method of forming the preliminary gap-fill insulating layer may comprise, for example, injecting a gas mixture containing a first precursor and a second precursor into a processing chamber. The first precursor may include silicon (Si) and the second precursor may include at least one selected from the group consisting of nitrogen, hydrogen, oxygen, and a mixture thereof. For example, the first precursor containing silicon may be at least one of silane, disilane (DS), methylsilane (MS), dimethylsilane (DMS), trimethylsilane (TMS), tetramethylsilane (TMS), tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DMDMS), trisilylamine (TSA), disilylamine (DSA), a $Si_xN_yH_zO_{zz}$-precursor, a $Si_xN_yH_zCl_{zz}$-precursor, and a mixture thereof. The second precursor that may be referred to as a processing precursor may comprise at least one of a mixture of H2 and N2, N2, NH3, NH4OH, N2, N2H4, NO, N2O, NO2, H2, O3, O2, H2O2, vapor, and a mixture thereof. In one embodiment, the process of forming the preliminary gap-fill insulating layer is performed at a temperature of less than about 100° C.

The process of hardening the preliminary gap-fill insulating layer may comprise performing a heat treatment process at least once. The process of hardening the preliminary gap-fill insulating layer may be performed, for example, by using a wet annealing process in a temperature range of about 500° C. to about 700° C. or a nitrogen annealing process in a temperature range of about 600° C. to about 800° C. The buffer oxide layer 142 may have a density denser than that of the gap-fill insulating layer 130.

Oxygen atoms contained in the gap-fill insulating layer 130 may move to regions surrounding the gap-fill insulating layer 130 by the heat treatment process. If there is no oxidation blocking layer 146, the oxygen atoms may move to the sidewalls of the preliminary fin structures PF. As mentioned above, the buffer semiconductor pattern 111 constituting the bottom of the preliminary fin structures PF may have an oxidation rate greater than that of the preliminary channel patterns 121. Therefore, the sidewalls of the bottom of the preliminary fin structures PF may be oxidized.

According to an example embodiment of the inventive concepts, the oxidation blocking layer 146 may obstruct or reduce movements of oxygen atoms from the gap-fill insulating layer 130 to the preliminary fin structures PF during the heat treatment process, therefore the oxidation blocking layer 146 may obstruct or reduce the phenomenon that the sidewalls of the bottom of the preliminary fin structures PF would be oxidized.

Referring to FIGS. 1 and 5a through 5c, gap-fill insulating layer patterns 131 may be formed by removing the upper portion of the gap-fill insulating layer 130. The method of forming the gap-fill insulating layer patterns 131 may comprise, for example, planarizing and/or etching the gap-fill insulating layer 130. The uppermost surface of the gap-fill insulating layer patterns 131 may have a level higher than that of the bottom of the preliminary channel patterns 121, and higher than that of the uppermost surface of the buffer semiconductor pattern 111. Therefore, an upper portion of the oxidation blocking layer 146 may be exposed within the trench.

Referring to FIGS. 1 and 6a through 6c, the exposed portion of the oxidation blocking layer 146 may be removed to form a plurality of oxidation blocking layer patterns 147. Therefore, an upper portion of the buffer oxide layer 142 may be exposed. The exposed portion of the buffer oxide layer 142 may be removed to form a plurality of buffer oxide layer patterns 143. As the result, a plurality of device isolation structures DS comprising the buffer oxide layer patterns 143, the oxidation blocking layer patterns 147 and the gap-fill insulating layer patterns 131 may be formed in the trenches TH. The process of forming the buffer oxide layer patterns 143 and the oxidation blocking layer patterns 147 may include, for example, at least one of a wet etching process and a dry etching process. Thus, uppermost surfaces and upper sidewalls of the preliminary channel patterns 121 may be exposed after forming the device isolation structures DS.

Referring to FIGS. 1 and 7a through 7c, a dummy gate dielectric layer 157 may be formed on the preliminary fin structures PF. The dummy gate dielectric layer 157 may include, for example, a silicon oxide layer and be formed by using, for example, a chemical vapor deposition process and/or a thermal oxidation process. A dummy gate pattern 151 crossing over the preliminary fin structures PF may be formed on the dummy gate dielectric layer 157. A capping layer pattern 153 may be formed on the dummy gate pattern 151. The method of forming the dummy gate pattern 151 may include forming a dummy gate layer and a capping layer on the preliminary fin structure PF and patterning the dummy gate layer and the capping layer. The dummy gate layer may be planarized before forming the capping layer thereon. The capping layer pattern 153 may have an etch selectivity with respect to the dummy gate pattern 151. In one embodiment, the dummy gate pattern comprises a polysilicon layer and the capping layer pattern 153 may comprise at least one of a silicon oxide layer, silicon oxynitride layer, and a silicon nitride layer. Optionally, the capping layer pattern 153 may be omitted.

A gate spacer layer may be conformally formed on the substrate 100. The gate spacer layer may be etched by using, for example, an isotropic etching process to form a gate spacer 155 on the sidewall of the dummy gate pattern 151. When forming the gate spacer 155, a fin spacer 159 may be formed on the sidewall of the preliminary fin structures PF, simultaneously. In one embodiment, the gate spacer 155 and the fin spacer 159 may include at least one of a silicon oxide layer, silicon oxynitride layer, and a silicon nitride layer.

Referring to FIGS. 1 and 8a through 8c, a plurality of upper portions of the preliminary fin structures PF which are not covered by the dummy gate pattern 151 and the gate spacer 155 may be partially removed to form a plurality of channel patterns 122. Each channel pattern 122 may be referred to herein simply as a channel. At this moment, a plurality of upper portions of the buffer semiconductor patterns 111a may be exposed. Therefore, fin structures FS comprising the buffer semiconductor patterns 111a and the channel patterns 122 may be formed on the substrate 100. A plurality of upper portions of the dummy gate dielectric layer 157 and the fin spacer 159 may be removed, simultaneously.

Figure 9A:
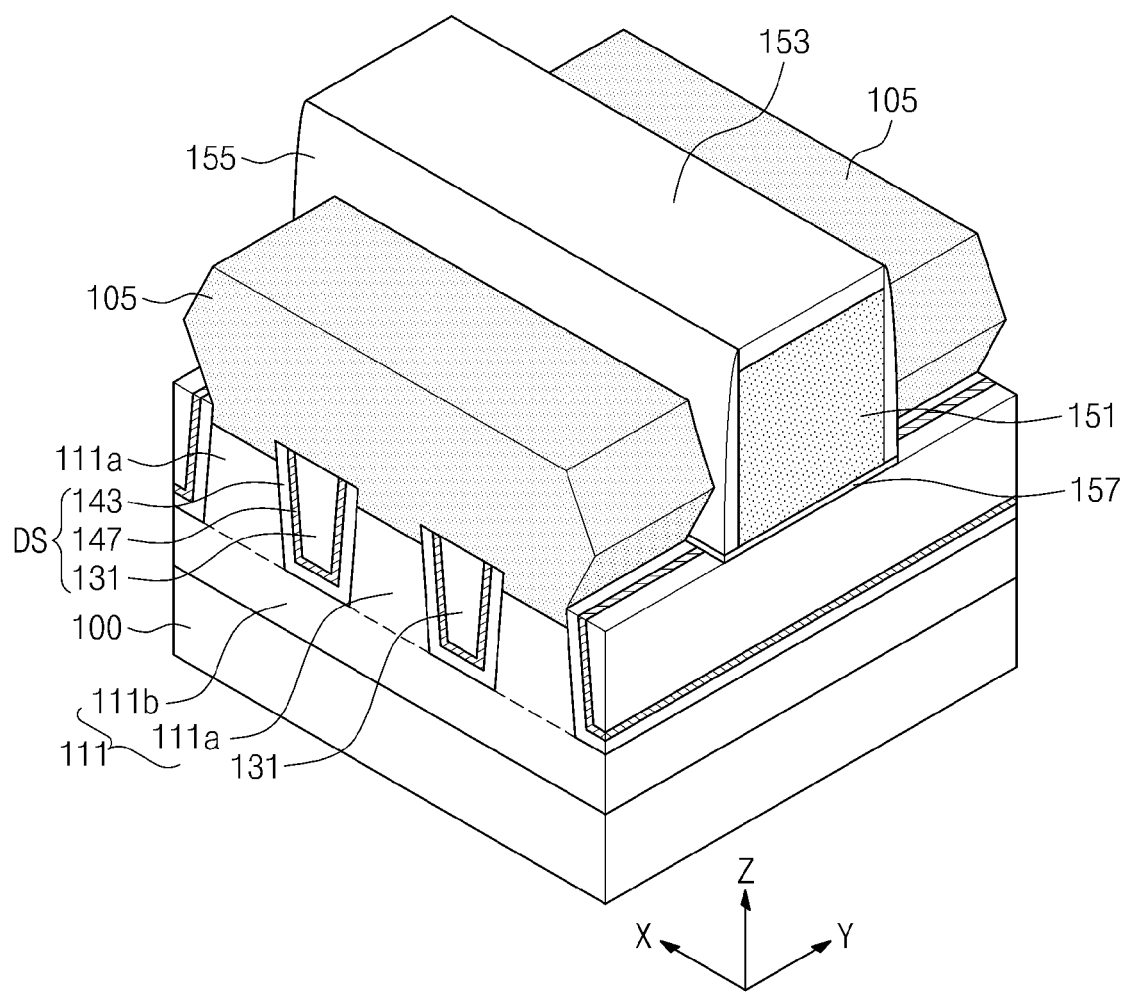
Figure 9B:
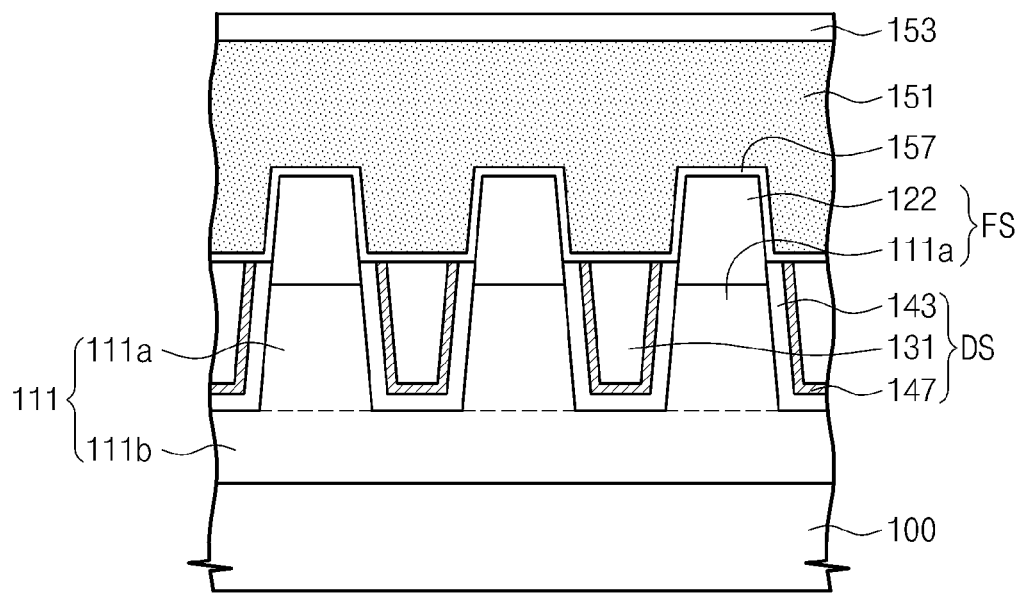
Figure 9C:
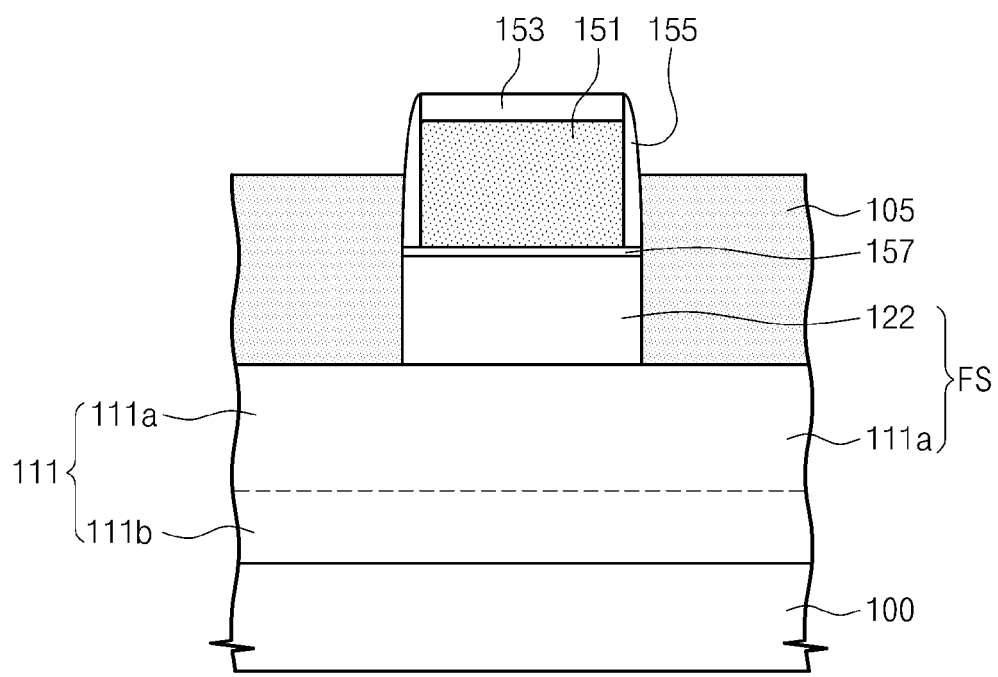
Figure 10A:
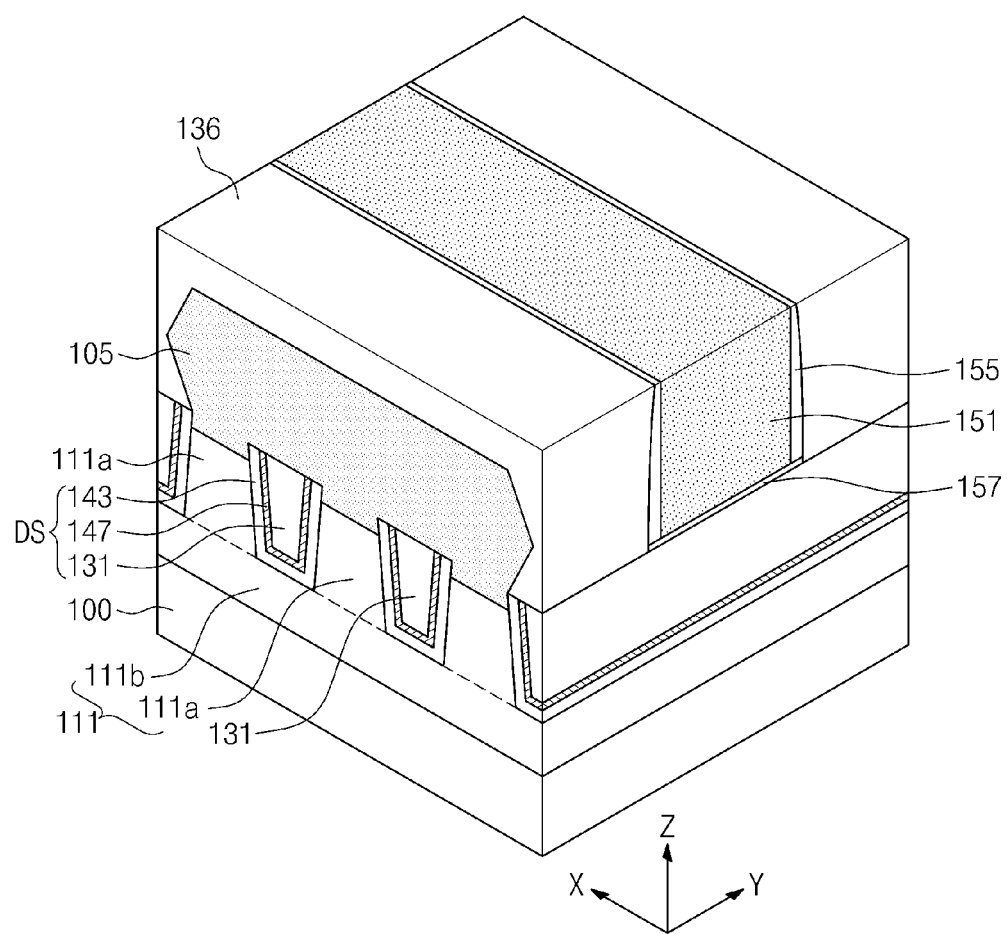
Figure 10B:
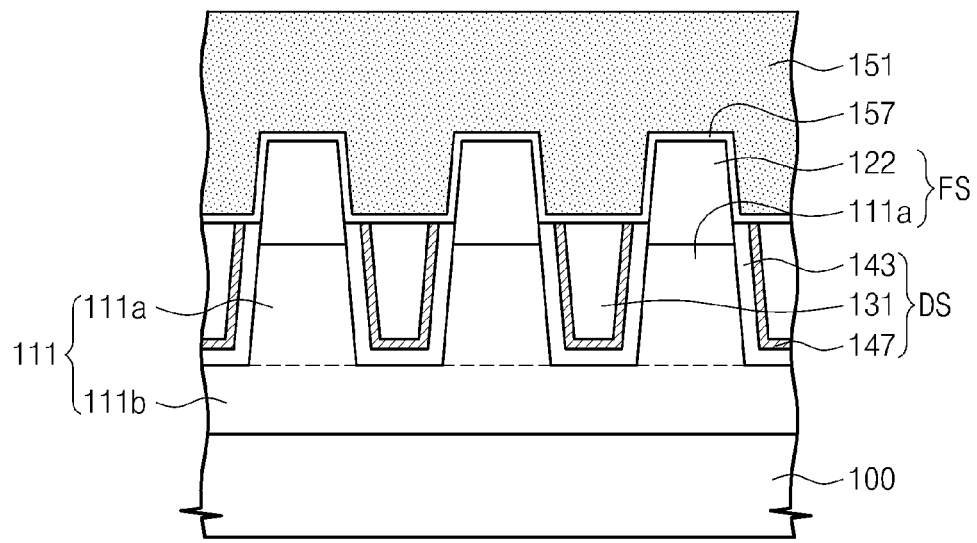
Figure 10C:
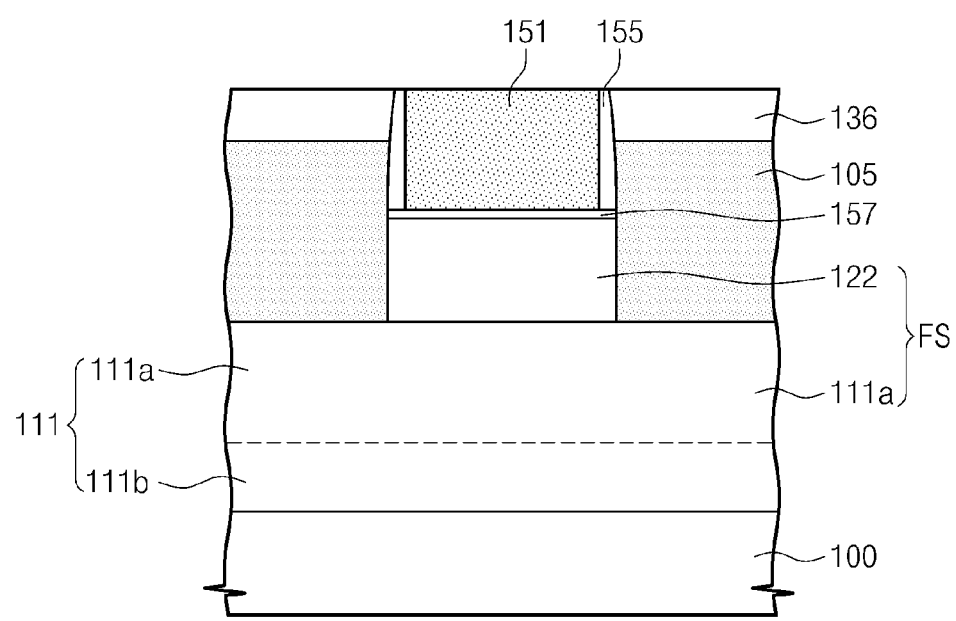
Figure 11A:
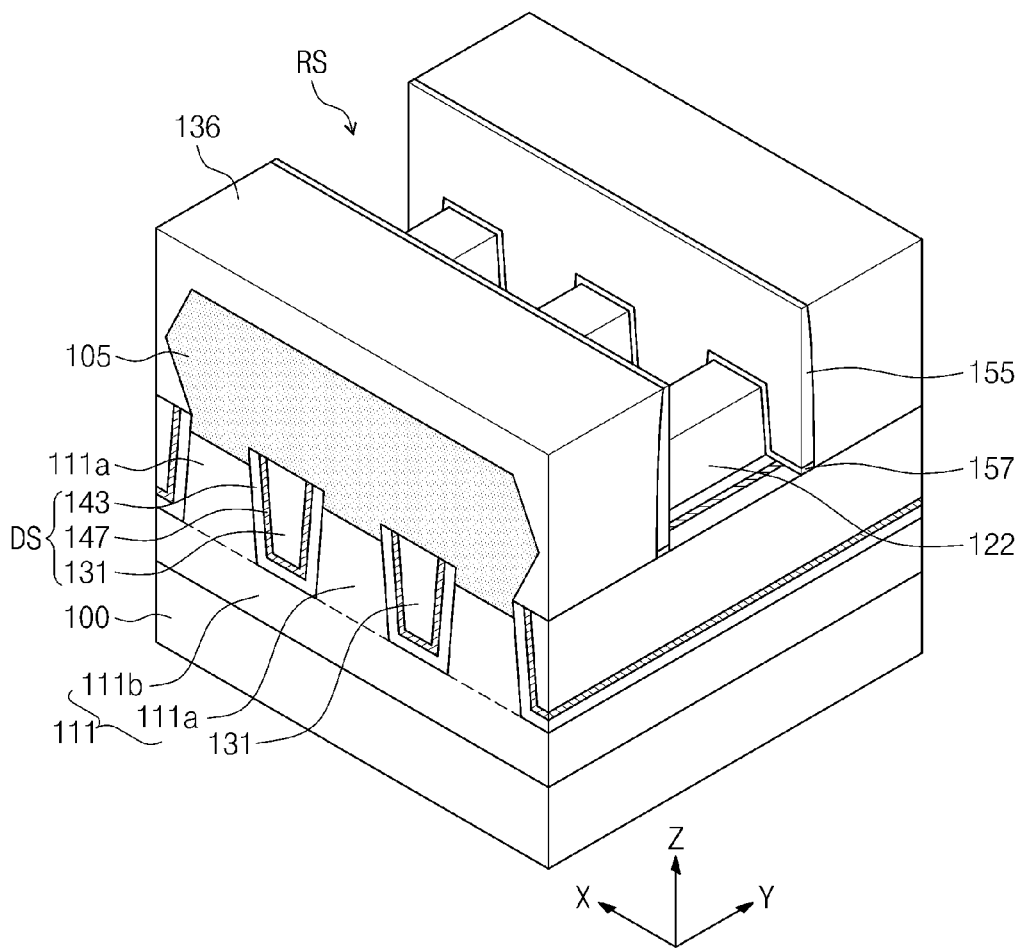
Figure 11B:
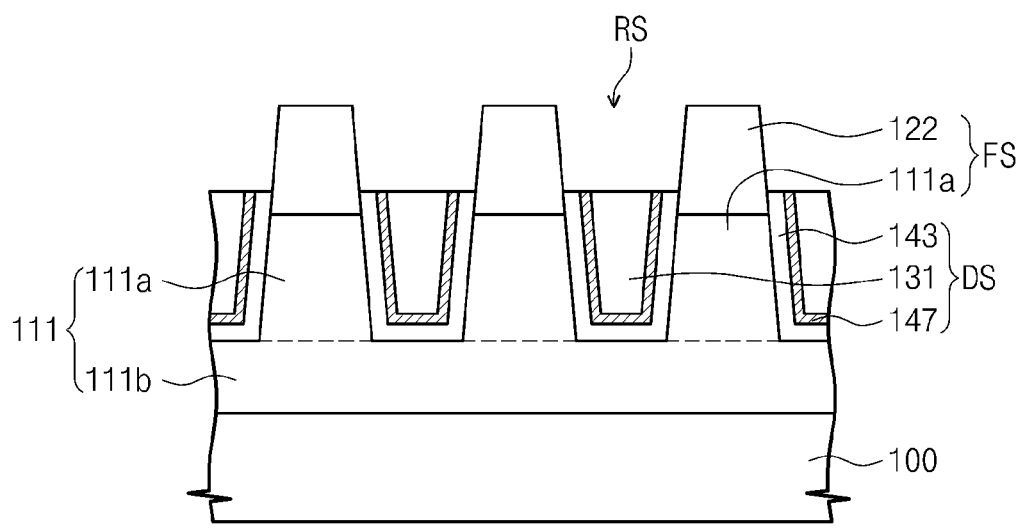
Figure 11C:
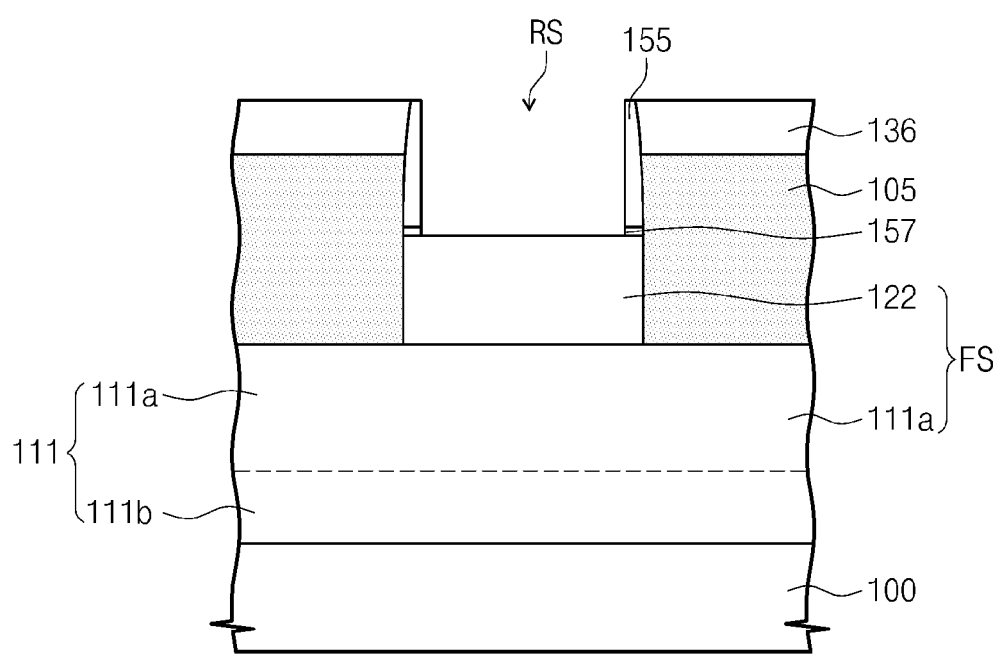
Figure 12A:
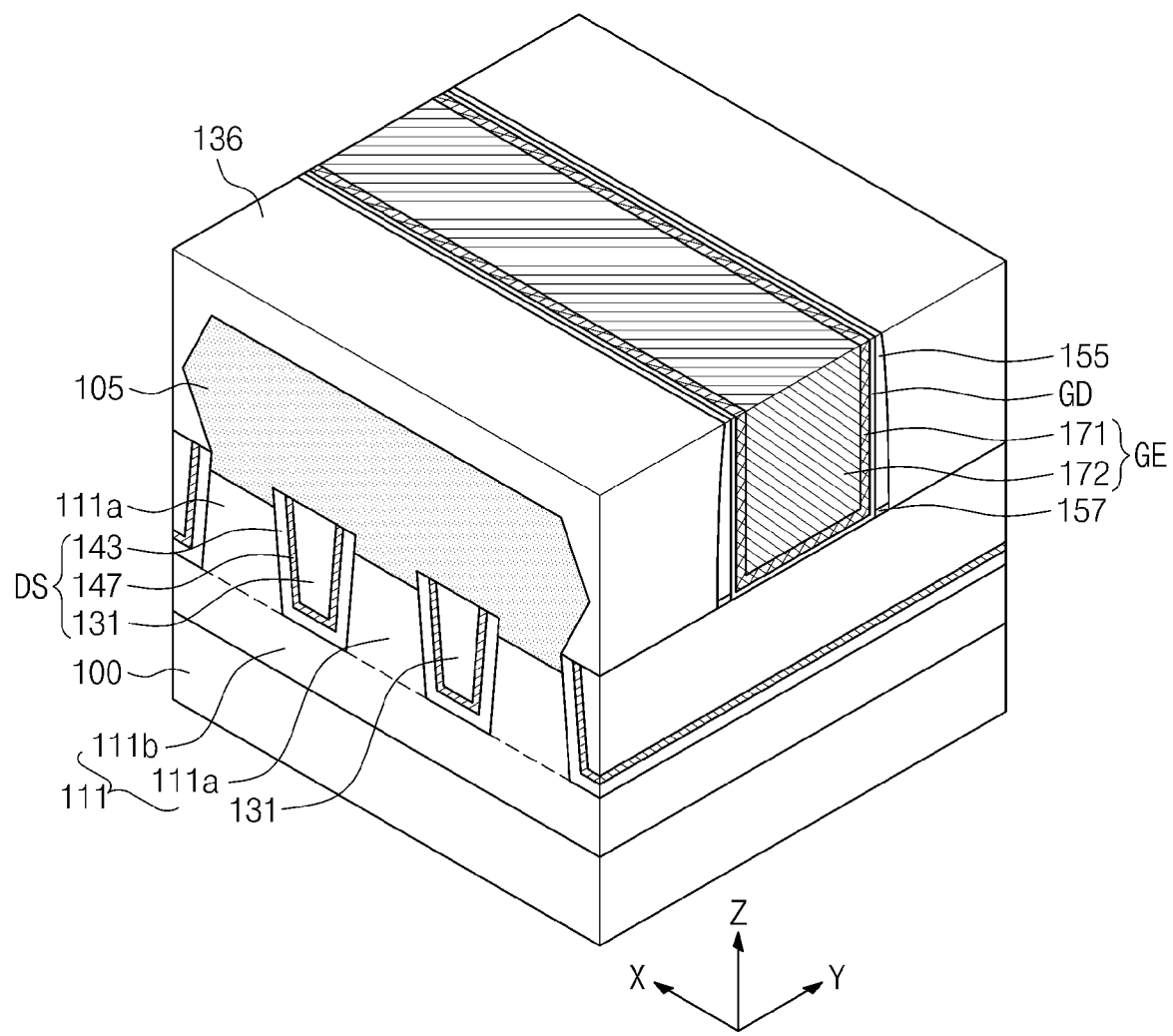
Figure 12B:
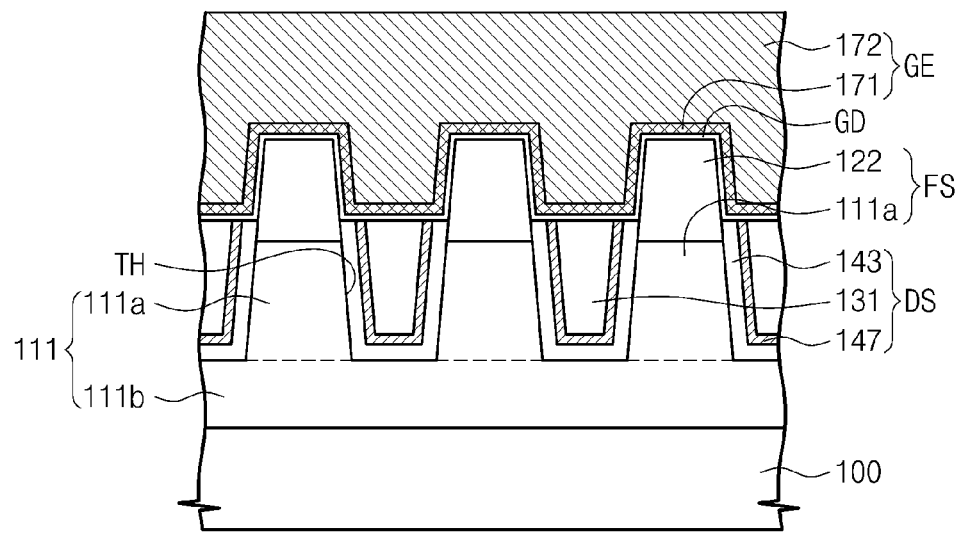
Figure 12C:
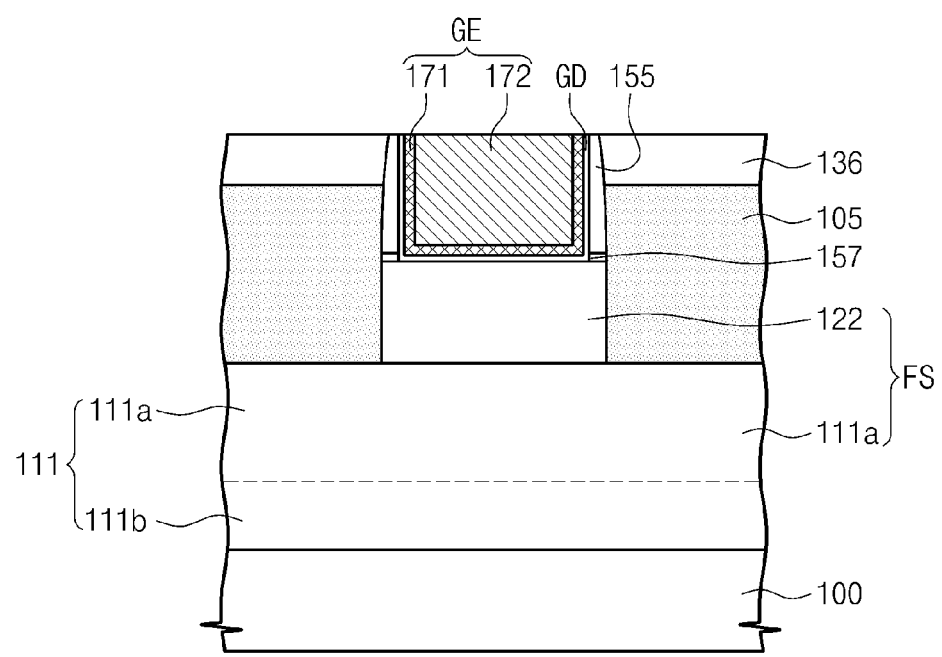

Referring to FIGS. 1 and 9a through 9c, a plurality of source/drain patterns 105 may be formed on the exposed buffer semiconductor patterns 111a, for example, by a selective epitaxial growth process using the exposed buffer semiconductor patterns 111a as a seed layer. In certain embodiments, the source/drain patterns 105 may be formed by using a chemical vapor deposition process or a molecular beam epitaxy (MBE) process. As shown in FIG. 9a, the source/drain patterns 105 may connect between adjacent upper buffer semiconductor patterns 111a. And thus the upper buffer semiconductor patterns 111a may be electrically connected with each other during the selective epitaxial growth process. On the contrary, the source/drain patterns 105 may form separate structures separated from each other to form separated transistors each having a fin structure.

If the field effect transistor (FET) according to an example embodiment of the inventive concepts is a PMOS transistor, the source/drain patterns 105 may have a material having a lattice constant greater than that of the channel patterns 122. For example, the channel patterns 122 may be formed of silicon (Si) and the source/drain patterns 105 may be formed of silicon germanium (SiGe). On the contrary, if the field effect transistor (FET) according to an example embodiment of the inventive concepts is a NMOS transistor, the source/drain patterns 105 may have a lattice constant equal to that of the channel patterns 122.

Referring to FIGS. 1 and 10a through 10c, an insulating dielectric layer 136 may be formed on the source/drain patterns 105. The insulating dielectric layer 136 may be planarized to expose the upper surface of the dummy gate pattern 151. The insulating dielectric layer 136 may include, for example, at least one of a silicon oxide layer and a silicon oxynitride layer. In one embodiment, the insulating dielectric layer 136 is formed by a chemical vapor deposition process.

Referring to FIGS. 1 and 11a through 11c, a recess region RS may be formed to expose the channel patterns 122 by removing the dummy gate pattern 151 and a portion of the dummy gate dielectric layer 157. In order to control the threshold voltage of the field effect transistor, an ion implantation process may be performed to the exposed channel patterns 122. In one embodiment, if the field effect transistor is a PMOS transistor, boron (B) may be injected into the channel patterns 122 by using the ion implantation process. On the contrary, if the field effect transistor is a NMOS transistor, phosphorus (P) or arsenic (As) may be injected into the channel patterns 122 by using the ion implantation process. In certain embodiments, the ion implantation process may be performed at the steps corresponding FIGS. 6a through 6c otherwise at the steps corresponding to FIG. 2, optionally.

Referring to FIGS. 1 and 12a through 12c, a gate dielectric layer GD and a gate electrode GE are formed in the recess region RS and on the insulating dielectric layer 136. The gate dielectric layer GD and the gate electrode GE may be planarized to expose the upper surface of the insulating dielectric layer 136. The gate dielectric layer GD may include, for example, a high-k dielectric layer having a dielectric constant greater than that of a silicon oxide layer. For example, the gate dielectric layer GD may include hafnium oxide, zirconium oxide, and/or tantalum oxide. The gate electrode GE may comprise a lower gate conductive layer 171 and an upper gate conductive layer 172. The lower gate conductive layer 171 may include, for example, titanium nitride, tantalum nitride, and/or tungsten nitride. The upper gate conductive layer 172 may include, for example, titanium, tantalum, and/or tungsten. Thus, in one embodiment, the lower gate conductive layer 171 includes nitrogen, and the upper gate conductive layer 172 does not include nitrogen. In certain embodiments, the gate electrode GE and the gate dielectric layer GD are formed by using a chemical vapor deposition process or physical vapor deposition process.

According to an example embodiment of the inventive concepts, the oxidation blocking layer patterns 147 are disposed between the upper buffer semiconductor patterns 111a and the gap-fill insulating layer patterns 131. Therefore, the oxidation blocking layer 146 may obstruct or reduce the phenomenon of the upper buffer semiconductor patterns 111a being oxidized during the FCVD process for deposing the gap-fill insulating layer 130.

A semiconductor according to an example embodiment of the inventive concepts will now be described again referring to FIGS. 1 and 12a through 12c.

A buffer semiconductor pattern 111 and a plurality of channel patterns 122 may be successively formed on a substrate 100. The substrate 100 may include a bulk silicon substrate or a silicon-on-insulator (SOI) substrate. The substrate 100 may include, for example, silicon (Si), germanium GE, silicon germanium (SiGe), indium antimonide (InSb), lead telluride (PbTe), indium arsenide (InAs), indium phosphide (InP), gallium arsenide (GaAs), and/or gallium antimonide (GaSb). The buffer semiconductor pattern 111 may comprise an upper buffer semiconductor pattern 111a comprising a fin structure with the channel patterns 122 and a lower buffer semiconductor pattern 111b formed therebelow. The lower buffer semiconductor pattern 111b may be formed on the substrate 100 and be connected to the bottom of the fin structures FS.

The buffer semiconductor pattern 111 may have a lattice constant different from that of the channel patterns 122. If the field effect transistor (FET) is a PMOS transistor, for example, the buffer semiconductor pattern 111 may have a lattice constant less than that of the channel patterns 122. In this case, the buffer semiconductor pattern 111 may induce a compressive stress to the channel patterns 122 which are formed thereon. As the result, mobility of holes disposed in the channel patterns 122 may be increased.

On the contrary, if the field effect transistor is an NMOS transistor, the buffer semiconductor pattern 111 may have a lattice constant greater than that of the channel patterns 122. In this case, the buffer semiconductor pattern 111 may induce a tensile stress to the channel patterns 122 which are formed thereon. As the result, mobility of electrons disposed in the channel patterns 122 may be increased.

The buffer semiconductor pattern 111 may have an oxidation rate greater than that of the channel patterns 122. For example, in certain embodiments, the buffer semiconductor pattern 111 may include silicon germanium ($Si_{1-x}Ge_x$) and the channel patterns 122 may include silicon (Si) or silicon germanium ($Si_{1-y}Ge_y$, y<x) having a germanium concentration less than that of the buffer semiconductor pattern 111. Thus, the germanium concentration of the buffer semiconductor pattern 111 may be greater than that of the channel patterns 122. Germanium (Ge) may weaken the bonding energy of silicon atoms disposed in the silicon germanium (SiGe) layer. Therefore, as the concentration of germanium (Ge) is higher, the oxidation rate of the silicon germanium (SiGe) layer may be faster. The buffer semiconductor pattern 111 may have a thickness thicker than that of the channel patterns 122.

A plurality of device isolation structures DS may be formed in a plurality of trenches TH disposed between the fin structures FS. The plurality of device isolation structures DS may include a plurality of gap-fill insulating layer patterns 131 and a plurality of oxidation blocking layer patterns 147 that are disposed between the gap-fill insulating layer patterns 131 and the upper buffer semiconductor patterns 111a. The plurality of device isolation structures DS may also include a plurality of buffer oxide layer patterns 143 that are disposed between the oxidation blocking layer patterns 147 and the upper buffer semiconductor patterns 111a.

At least one of the bottoms of the trenches TH may be defined by the upper surface of the lower buffer semiconductor pattern 111b. The sidewalls of the trenches TH may be defined by the sidewalls of the upper buffer semiconductor patterns 111a and sidewalls of the channel patterns 122. The buffer oxide layer patterns 143 and the oxidation blocking layer patterns 147 may be conformally formed along the sidewalls of the upper buffer semiconductor patterns 111a and part of the sidewalls of the channel patterns 122, and on the lower buffer semiconductor pattern 111b. The buffer oxide layer patterns 143 may contact to the upper surface of the lower buffer semiconductor pattern 111b. The gap-fill insulating layer patterns 131 may be formed on the oxidation blocking layer patterns 147 and may partially fill the trenches TH. Therefore, the sidewalls and the bottom of the gap-fill insulating layer patterns 131 may contact the oxidation blocking layer patterns 147.

The uppermost surfaces of the oxidation blocking layer patterns 147 may have level higher than that of the uppermost surface of the upper buffer semiconductor pattern 111b but lower than that of the uppermost surfaces of the fin structures FS. For example, the sidewall of the upper buffer semiconductor patterns 111a may be covered by the oxidation blocking layer patterns 147, therefore oxidation atoms may be blocked by the oxidation blocking layer patterns 147 when forming the gap-fill insulating layer patterns 131. In certain embodiments, the uppermost surfaces of the oxidation blocking layer patterns 147 and the gap-fill insulating layer patterns 131 may have substantially the same level.

The oxidation blocking layer patterns 147 may have a density denser than that of the buffer oxide pattern 143. The oxidation blocking layer patterns 147 may include nitrogen. For example, the oxidation blocking layer patterns 147 may include at least one of silicon nitride, silicon oxynitride, and silicon carbon nitride. On the contrary, the oxidation blocking layer patterns 147 may not include nitrogen. For example, the oxidation blocking layer patterns 147 may include silicon carbide.

The oxidation blocking layer patterns 147 may have a thickness thinner than that of the buffer oxide layer patterns 143. The oxidation blocking layer patterns 147 may have a thickness, for example, of about 50% to about 80% of the thickness of the buffer oxide layer patterns 143. For example, in one embodiment, the buffer oxide layer patterns 143 may have a thickness of about 3 nm and the oxidation blocking layer patterns 147 may have a thickness of about 2 nm.

A gate dielectric layer GD and a gate electrode GE may be formed on the fin structures FS. The gate dielectric layer GD and the gate electrode GE may cross over the fin structures FS. In one embodiment, the gate dielectric layer GD may include a high-k dielectric layer having a dielectric constant greater than that of a silicon oxide layer. For example, the gate dielectric layer GD may include hafnium oxide, zirconium oxide, and/or tantalum oxide. The gate electrode GE may comprise a lower gate conductive layer 171 and an upper gate conductive layer 172. The lower gate conductive layer 171 may include titanium nitride, tantalum nitride, and/or tungsten nitride. The upper gate conductive layer 172 may include titanium, tantalum, and/or tungsten.

A plurality of source/drain patterns 105 may be disposed at both sides of the channel patterns 122. The source/drain patterns 105 may have an elevated shape. Therefore, the upper surfaces of the source/drain patterns 105 may have a level higher than that of the channel patterns 122. The source/drain patterns 105 may be isolated from the gate electrode GE by a plurality of gate spacers 155.

If the field effect transistor (FET) according to an example embodiment of the inventive concepts is a PMOS transistor, the source/drain patterns 105 may have a lattice constant greater than that of the channel patterns 122. On the contrary, if the field effect transistor is a NMOS transistor, the source/drain patterns 105 may have a lattice constant equal to that of the channel patterns 122.

According to an example embodiment of the inventive concepts, the device isolation structures DS may include oxidation blocking layer patterns 147 that are disposed between the gap-fill insulating layer patterns 131 and the buffer semiconductor pattern 111. The device isolation structures DS may obstruct or reduce movements of oxygen atoms into the buffer semiconductor pattern 111 when forming the gap-fill insulating layer patterns 131, therefore the oxidation blocking layer patterns 147 may obstruct or reduce the phenomenon of the buffer semiconductor pattern 111 being oxidized. As a result, the oxidation blocking layer patterns 147 may obstruct or reduce the phenomenon of the stress induced into the channel patterns 122 being released.

Figure 13:
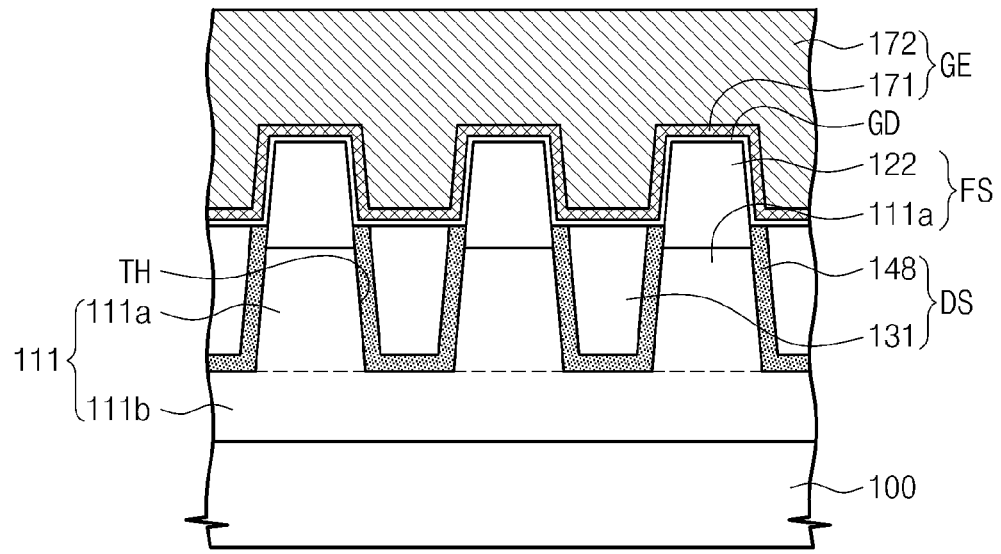
FIG. 13 is a cross-sectional view illustrating a semiconductor device including a transistor according to another example embodiment of the inventive concepts.

FIG. 13 is a cross-sectional view illustrating a semiconductor device including a transistor according to another example embodiment of the inventive concepts. To simplify the explanation, the duplicated description will be omitted.

A plurality of device isolation structures DS may include a plurality of oxidation blocking layer patterns 148 and a plurality of gap-fill insulating layer patterns 131 which are disposed in a plurality of trenches TH. The oxidation blocking layer patterns 148 may contact the plurality of upper buffer semiconductor patterns 111a. Thus, in this embodiment, the plurality of buffer oxide layer patterns, explained with referring to FIGS. 6a through 6c, are not disposed between the upper buffer semiconductor patterns 111a and the oxidation blocking layer patterns 148.

Figure 6A:
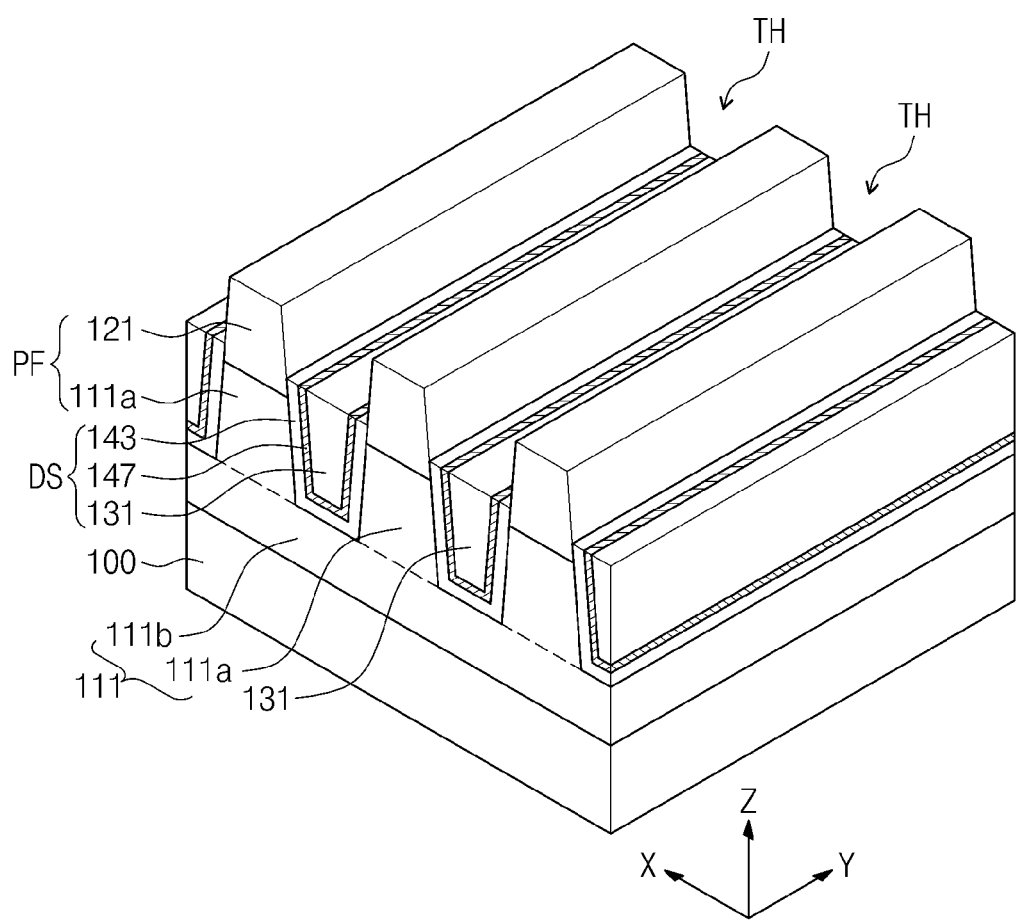
Figure 6B:
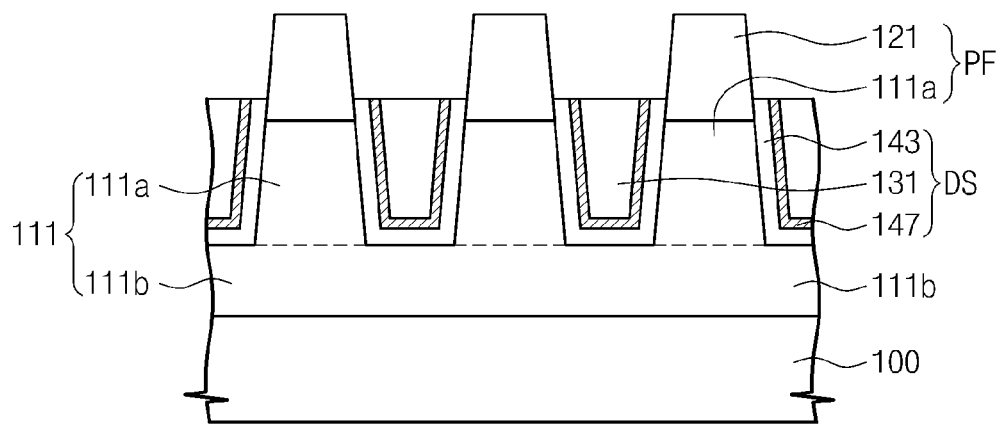
Figure 6C:
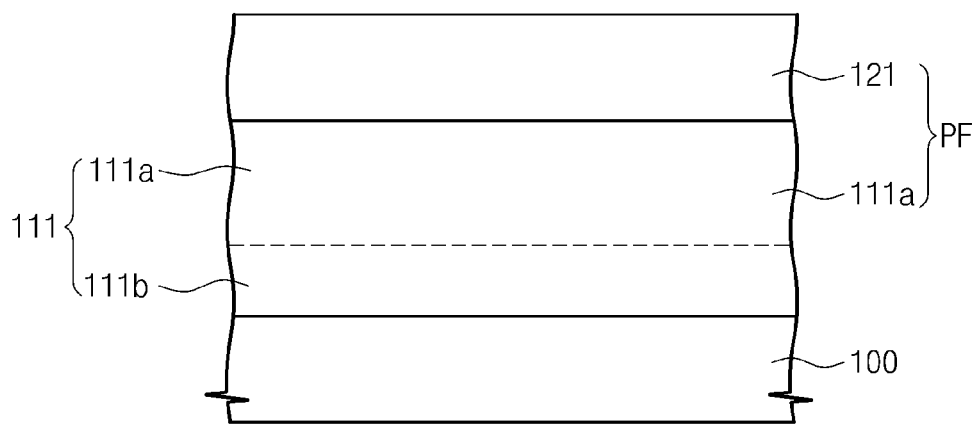
Figure 7A:
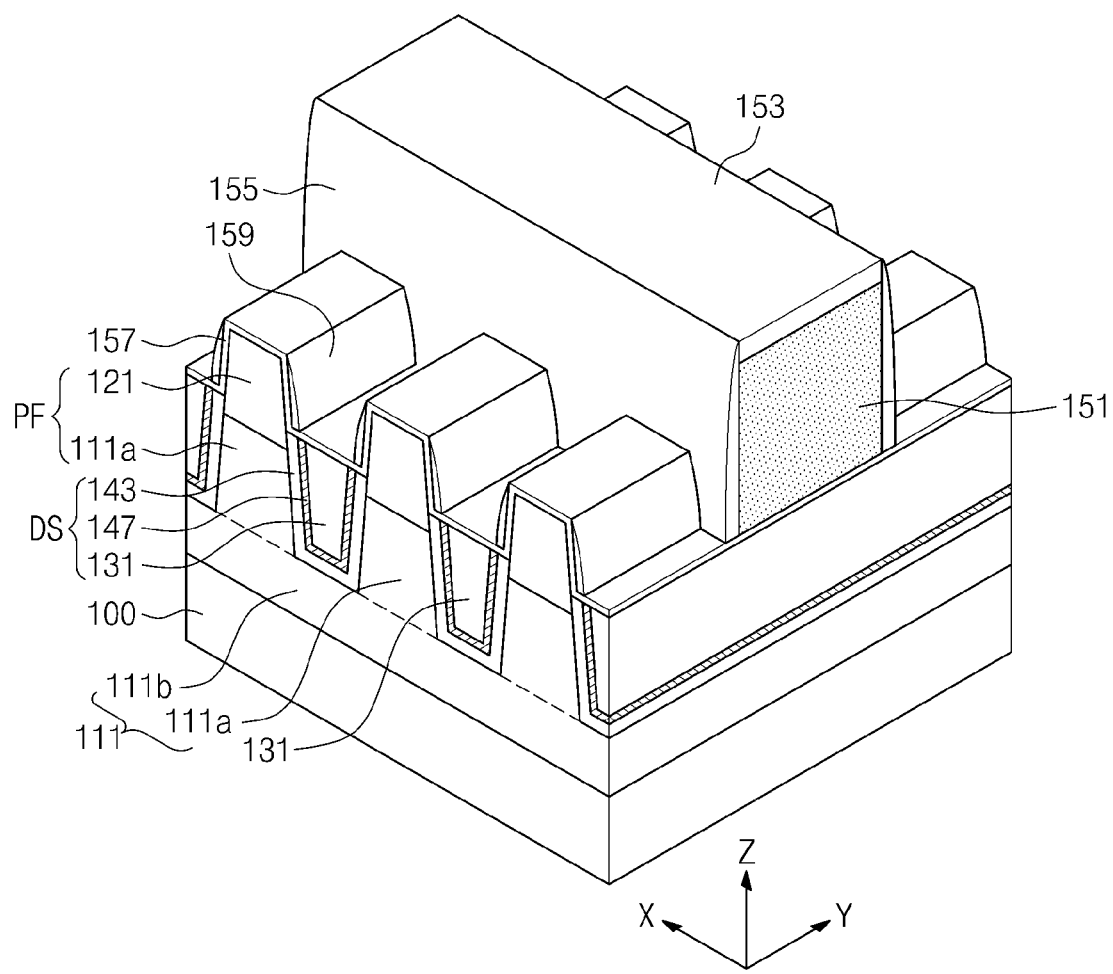
Figure 7B:
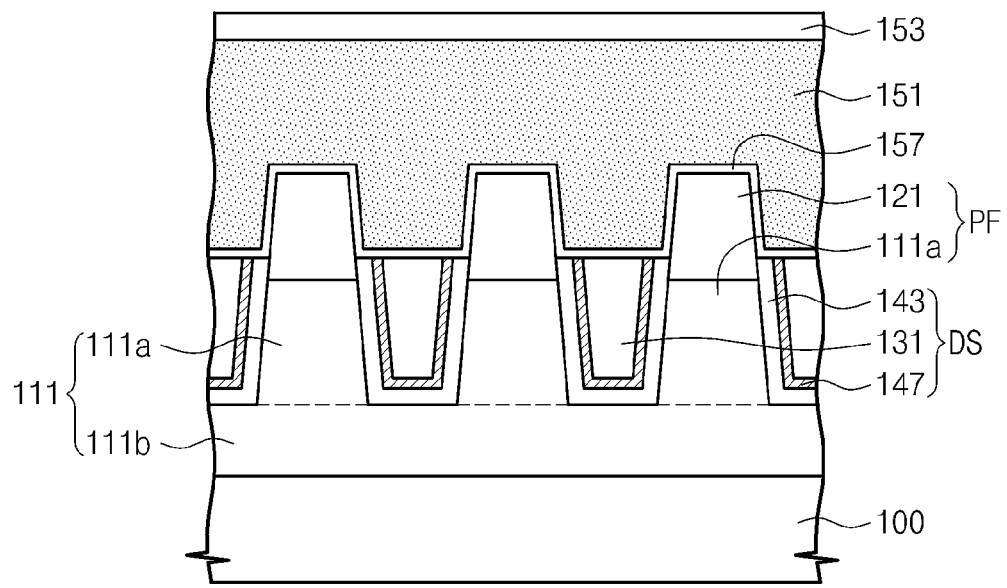
Figure 7C:
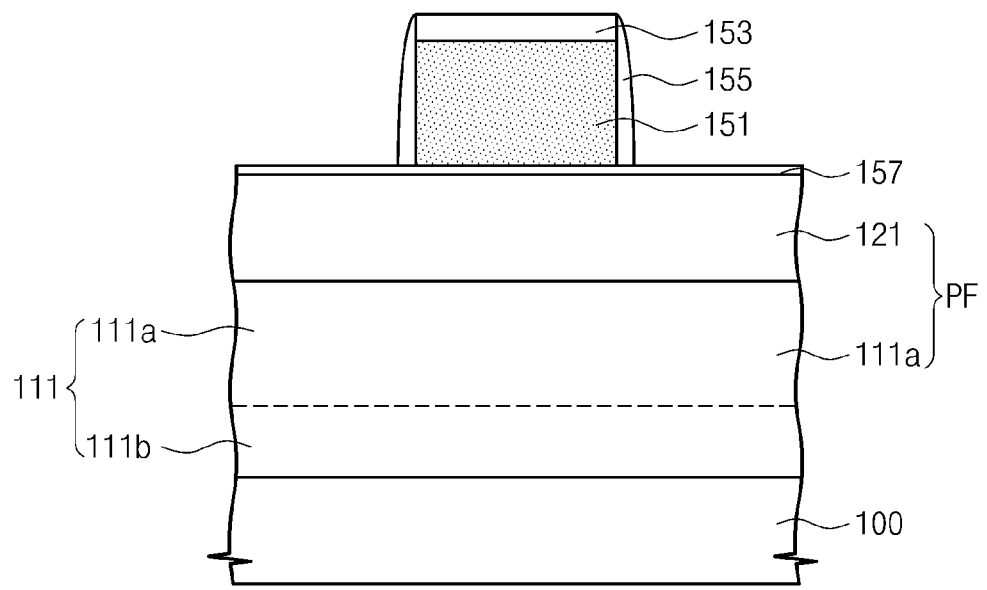
Figure 8A:
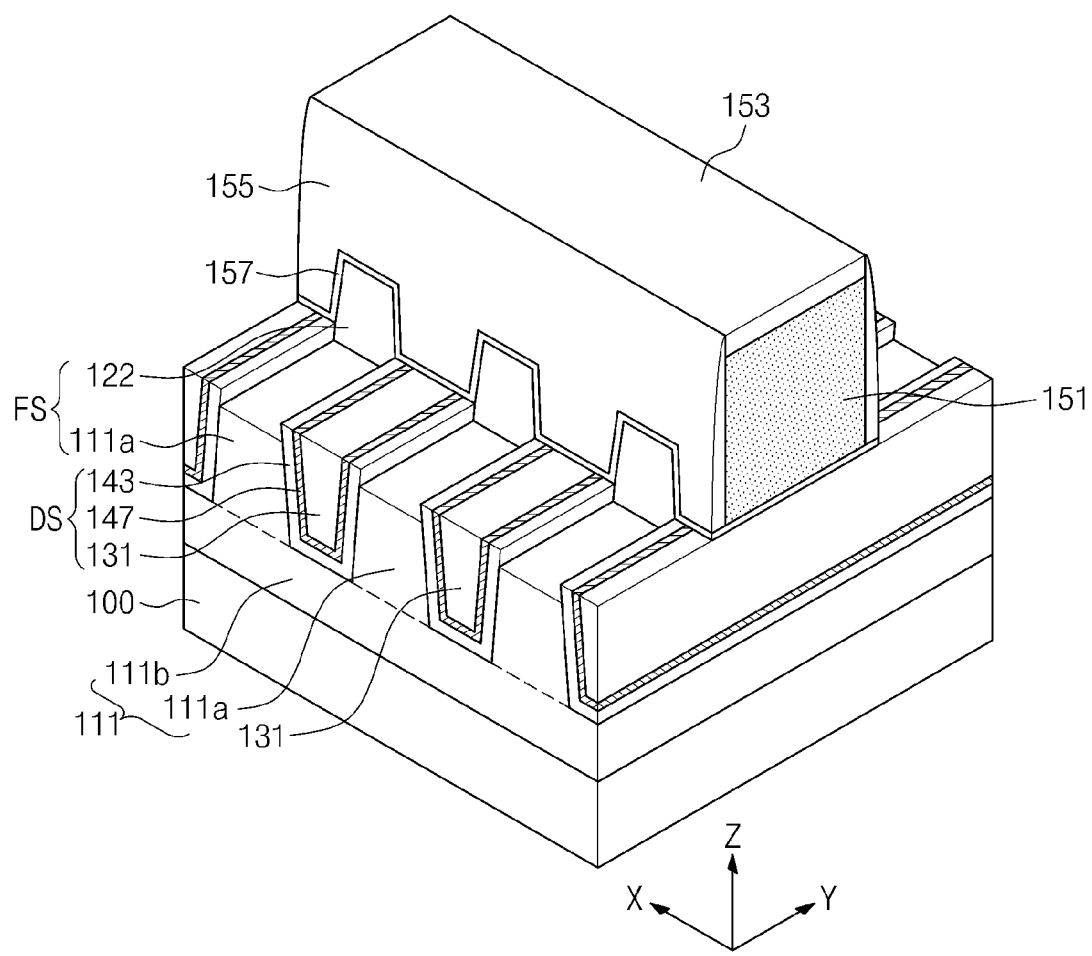
Figure 8B:
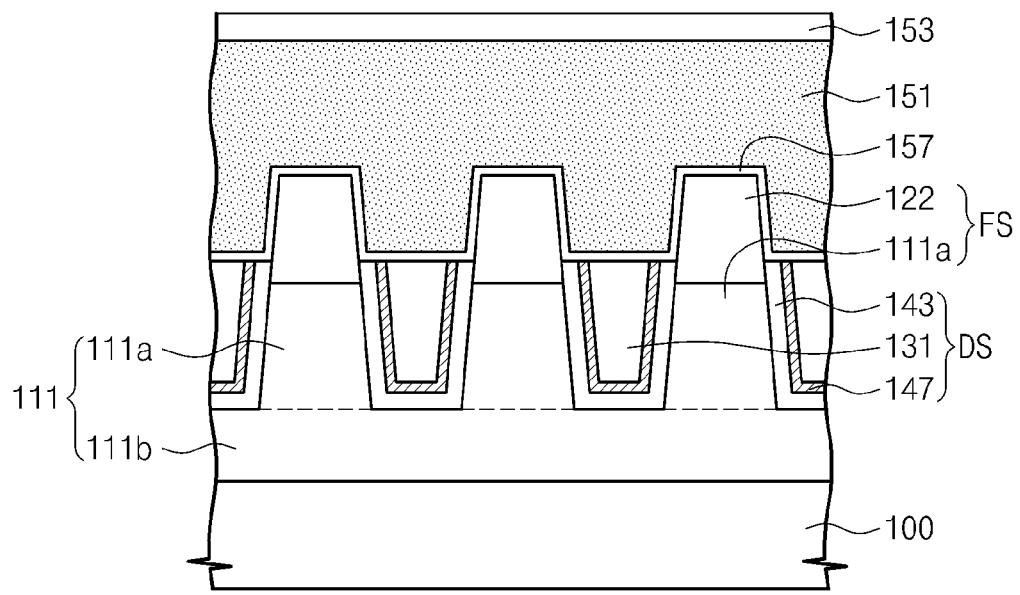
Figure 8C:
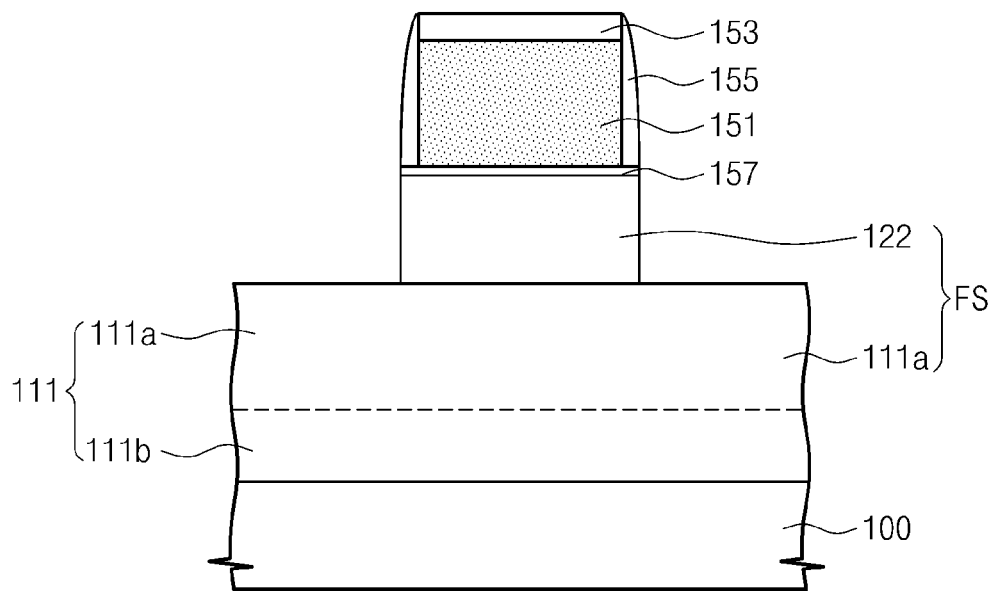

Alternatively, a plurality of buffer oxide layer patterns may be disposed between the upper buffer semiconductor patterns 111a and the oxidation blocking layer patterns 148, as explained with referring to FIGS. 6a through 6c. If the buffer oxide layer patterns are formed of silicon oxide, for example, nitrogen atoms which are contained in the oxidation blocking layer patterns 148 may be diffused into the buffer oxide layer patterns by a heat treatment process. Therefore, the buffer oxide layer patterns may be nitrided and the boundary between the buffer oxide layer patterns and the oxidation blocking layer patterns 148 may decrease or disappear. In this case, the nitrogen concentration of the oxidation blocking layer patterns 148 may be gradually reduced from the outer surface contacting the gap-fill insulating layer patterns 131 to the inner surface contacting the upper buffer semiconductor patterns 111a.

Figure 14:
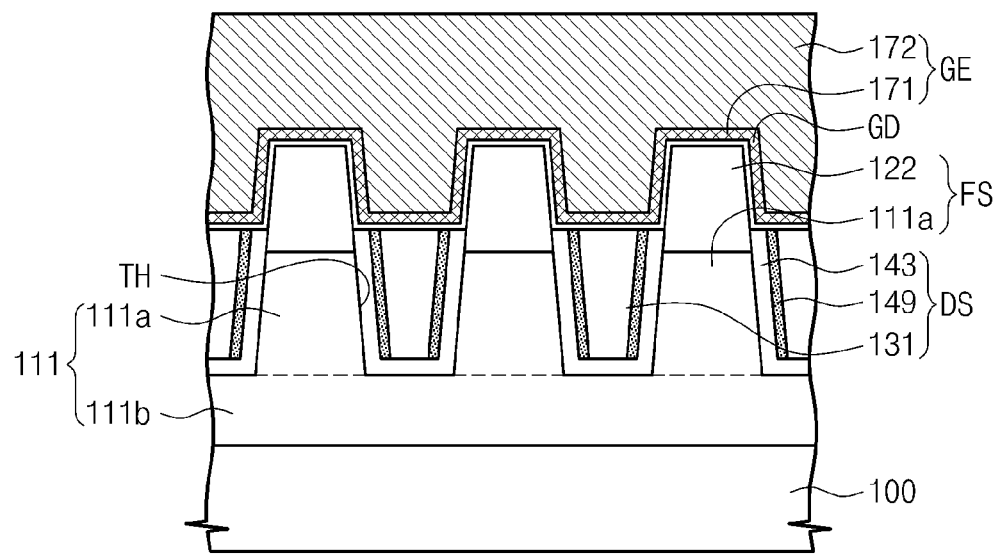
FIG. 14 is a cross-sectional view illustrating a semiconductor device including a transistor according to still another example embodiment of the inventive concepts.

FIG. 14 is a cross-sectional view illustrating a semiconductor device including a transistor according to still another example embodiment of the inventive concepts. To simplify the explanation, the duplicated description will be omitted.

A plurality of oxidation blocking layer patterns 149 may be formed on the sidewalls of the buffer oxide layer patterns 143 and may have a spacer shape. Thus, the oxidation blocking layer patterns 149 may expose, and thus not cover, an upper portion of the buffer oxide layer patterns 143 disposed at the bottoms of the trenches TH.

Figure 15A:
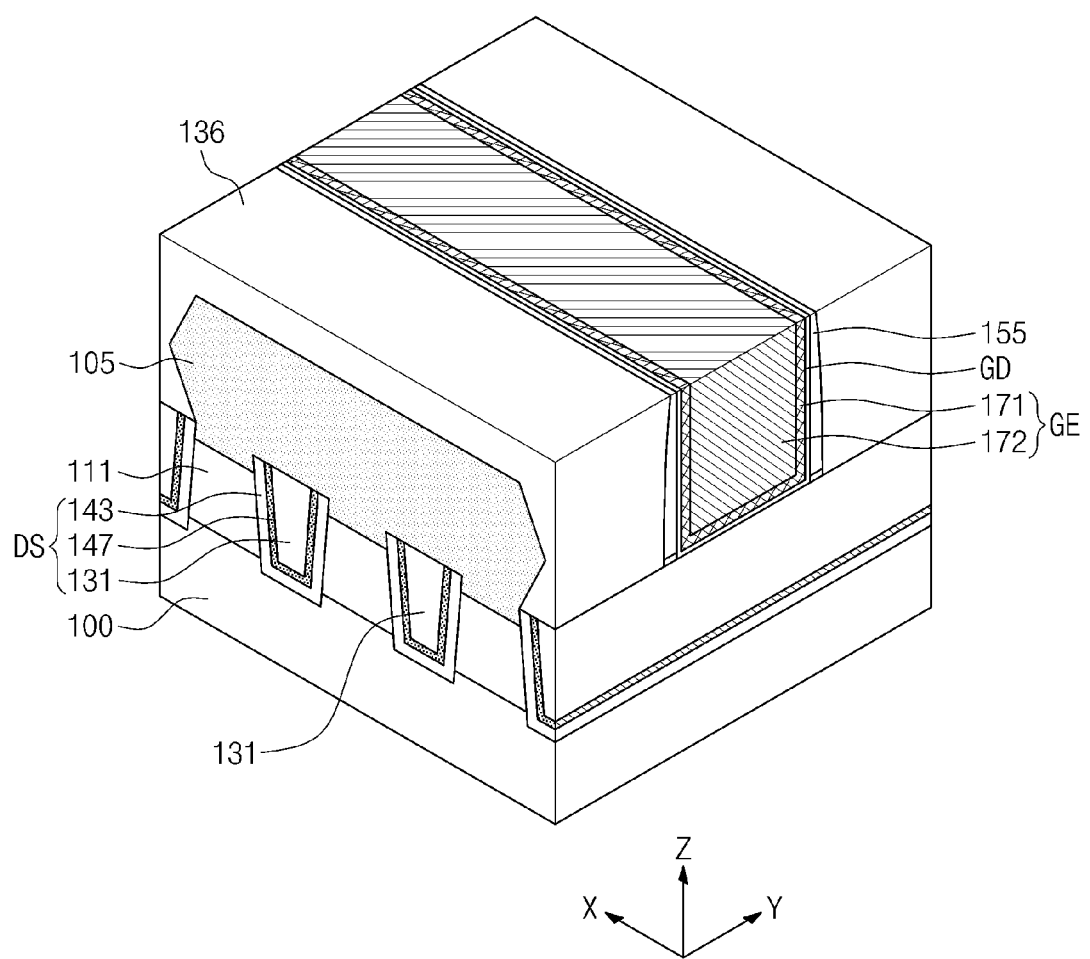
FIG. 15a is a perspective view illustrating a semiconductor device including a transistor according to still another example embodiment of the inventive concepts.
Figure 15B:
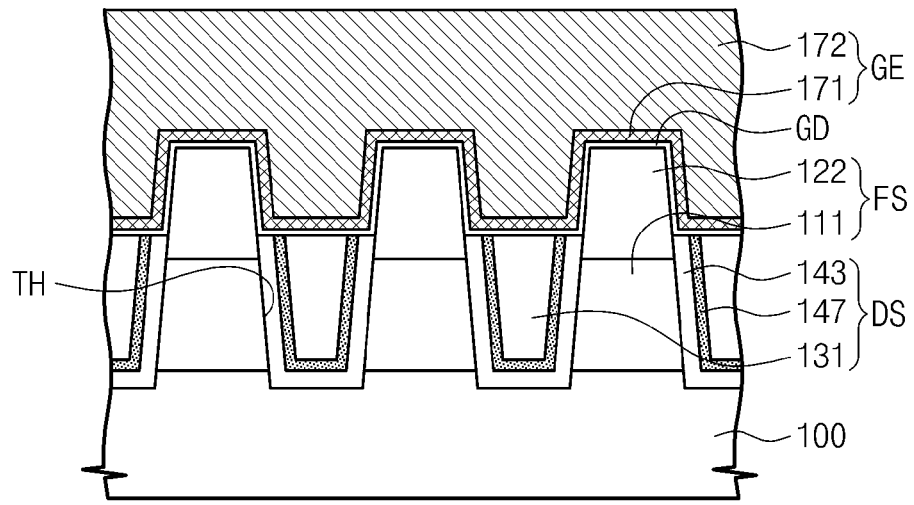
FIGS. 15b and 15c are cross-sectional views corresponding to lines A-A' and B-B' of FIG. 15a, respectively.
Figure 15C:
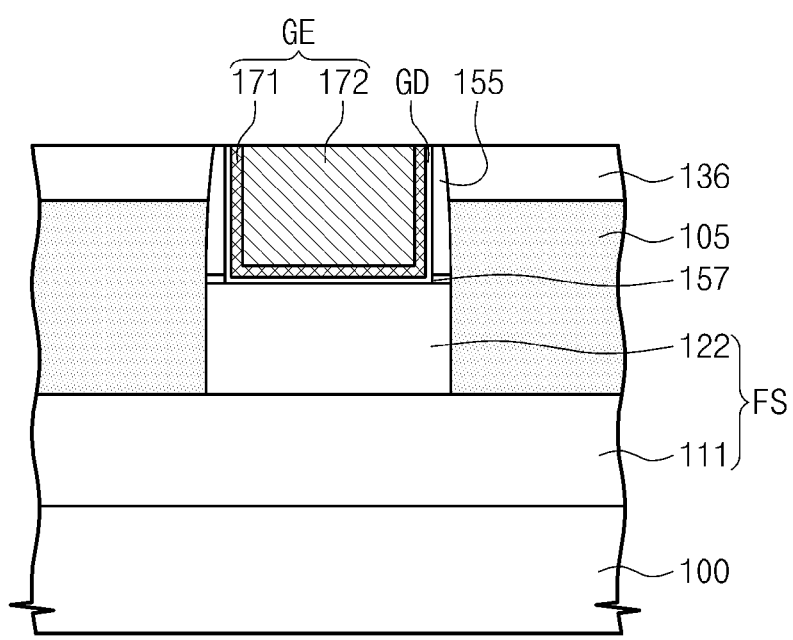

FIG. 15A is a perspective view illustrating a semiconductor device including a transistor according to still another example embodiment of the inventive concepts. FIGS. 15B and 15C are cross-sectional views corresponding to lines A-A' and B-B' of FIG. 15A, respectively. To simplify the explanation, the duplicated description will be omitted.

A plurality of device isolation structure DS may include a plurality of buffer oxide layer patterns 143, a plurality of oxidation blocking layer patterns 147, and a plurality of gap-fill insulating layer patterns 131. The device isolation structures DS may pass through the buffer semiconductor pattern 111 to contact an upper portion of the substrate 100. As shown in FIG. 15A-15C, a bottom-most surface of the device isolation structures DS may be below a top-most surface of the substrate 100.

Figure 16:
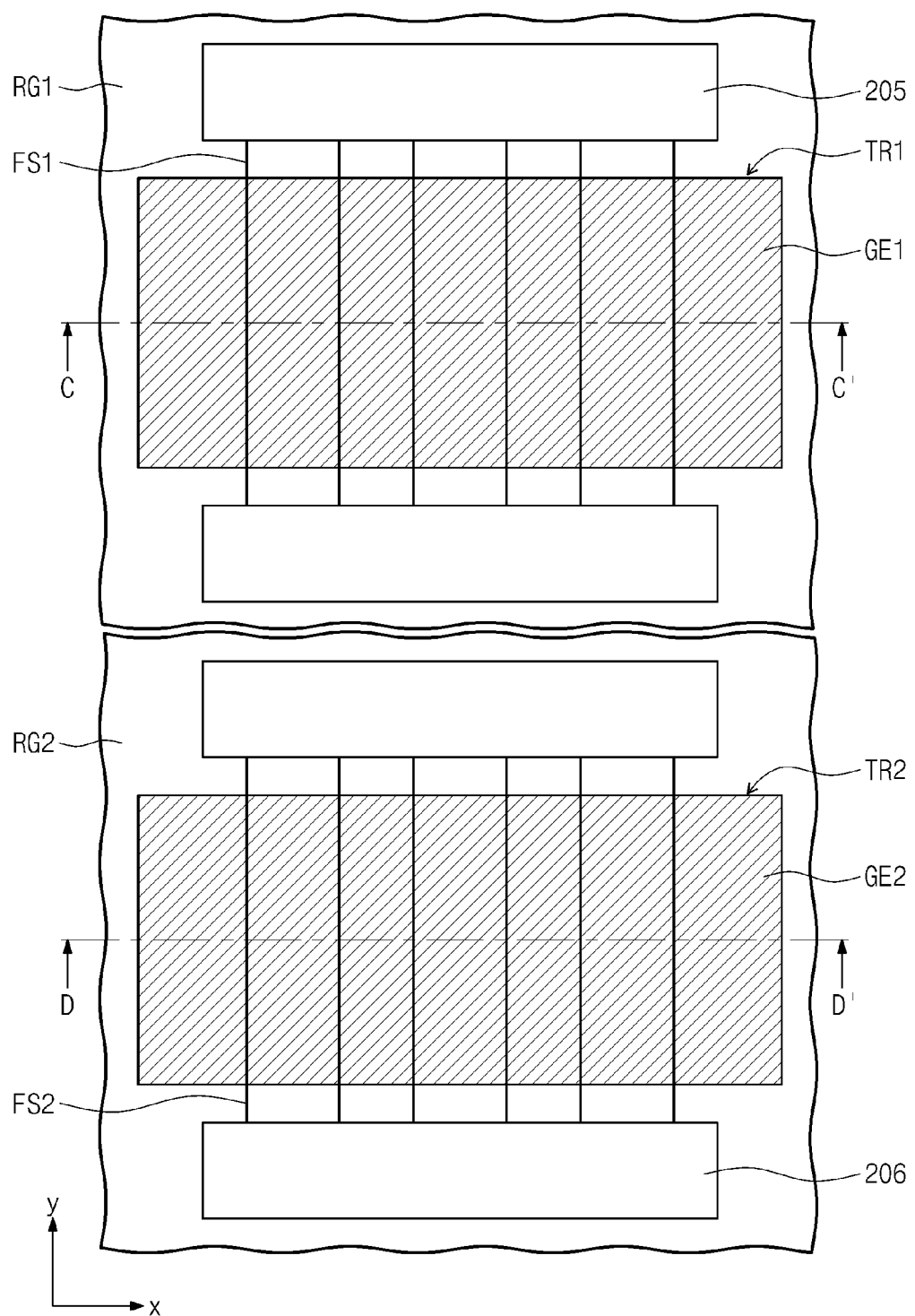
FIG. 16 is a plan view illustrating a semiconductor device including a transistor according to still another example embodiment of the inventive concepts.
Figure 17A:
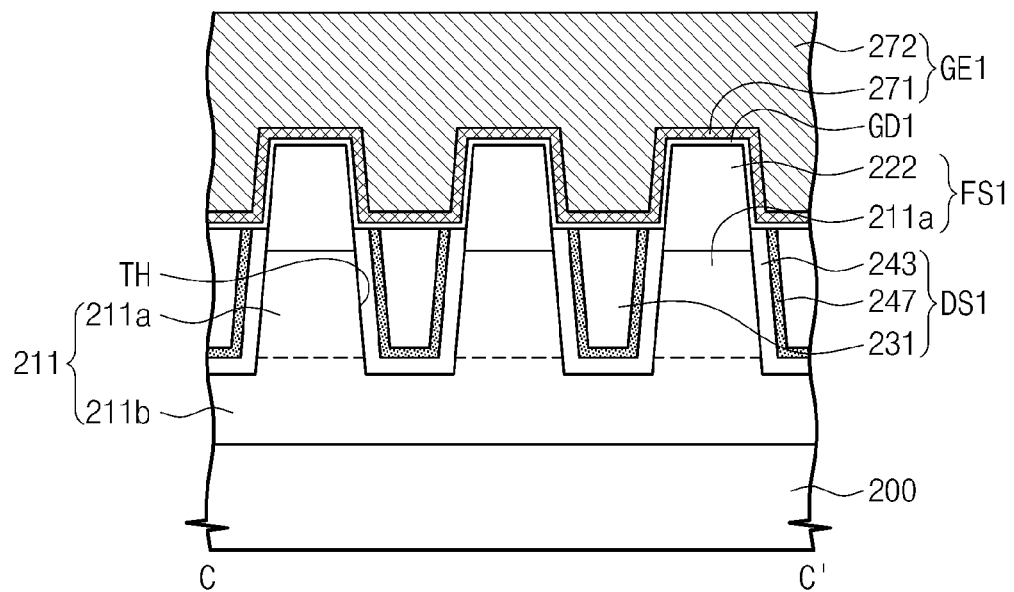
FIGS. 17a and 17b are cross-sectional views corresponding to lines C-C' and D-D' of FIG. 16, respectively.
Figure 17B:
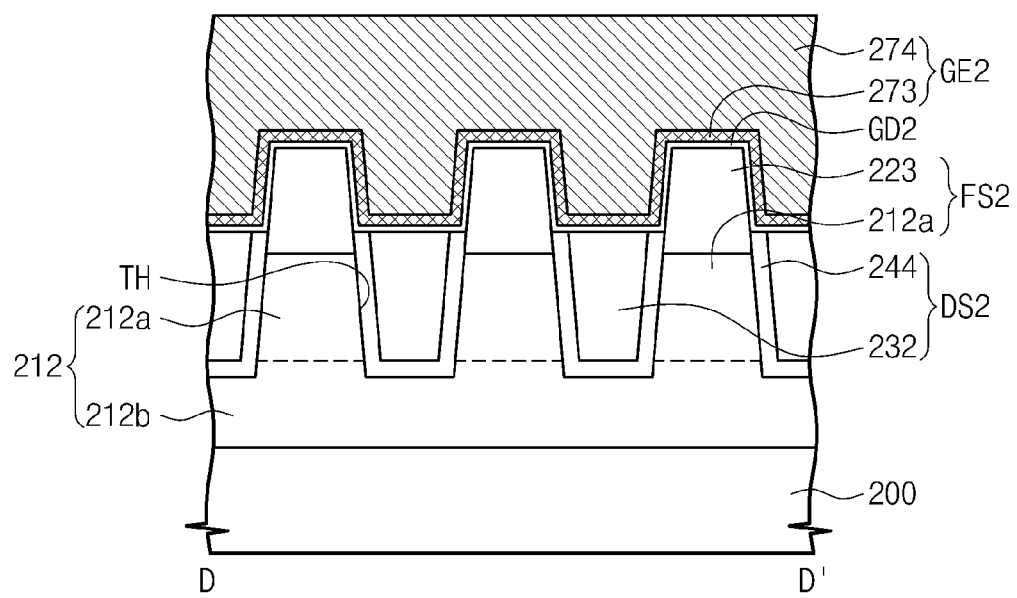

FIG. 16 is a plan view illustrating a semiconductor device including a transistor according to still another example embodiment of the inventive concepts. FIGS. 17a and 17b are cross-sectional views corresponding to lines C-C' and D-D' of FIG. 16, respectively. To simplify the explanation, the duplicated description will be omitted.

Referring to FIGS. 16, 17a, and 17b, a substrate 200 including a first region RG1 and a second region RG2 may be provided. A first transistor TR1 and a second transistor TR2 may be disposed in the first region RG1 and the second region RG2, respectively. For example, the first transistor TR1 may be a NMOS transistor and the second transistor TR2 may be a PMOS transistor. The substrate 200 may include a bulk silicon substrate or a silicon-on-insulator (SOI) substrate. The substrate 200 may include, for example, silicon (Si), germanium GE, silicon germanium (SiGe), indium antimonide (InSb), lead telluride (PbTe), indium arsenide (InAs), indium phosphide (InP), gallium arsenide (GaAs), and/or gallium antimonide (GaSb).

The first transistor TR1 may include a first buffer semiconductor pattern 211 and a plurality of first channel patterns 222. The first buffer semiconductor pattern 211 may include a first lower buffer semiconductor pattern 211b and a plurality of first upper buffer semiconductor patterns 211a. A plurality of first fin structures FS1 may include the first upper buffer semiconductor patterns 211a and the first channel patterns 222. The lower buffer semiconductor pattern 211b may contact the bottom of the first fin structures FS1.

If the first transistor TR1 is an NMOS transistor, the first buffer semiconductor pattern 211 may include a material having a lattice constant greater than that of the first channel patterns 222. Therefore, the first buffer semiconductor pattern 211 may induce a tensile stress into the first channel patterns 222 formed thereon.

The first buffer semiconductor pattern 211 may have a material having an oxidation rate greater than that of the first channel patterns 222. For example, the first buffer semiconductor pattern 211 may include silicon germanium ($Si_{1-x}Ge_x$) and the first channel patterns 222 may include silicon (Si) or silicon germanium ($Si_{1-y}Ge_y$, y<x) having a germanium concentration less than that of the first buffer semiconductor pattern 211. Therefore, the germanium concentration of the first buffer semiconductor pattern 211 may be greater than that of the channel patterns 222.

A first source/drain region 205 may be provided on both sidewalls of the first fin structures FS1. A first gate dielectric layer GD1 and a first gate electrode GE1 may be formed on the first fin structures FS1. The first gate electrode GE1 may include a lower gate conductive layer 271 and an upper gate conductive layer 272. The lower gate conductive layer 271 may include, for example, titanium nitride, tantalum nitride, and/or tungsten nitride. The upper gate conductive layer 272 may include, for example, titanium, tantalum, and/or tungsten.

The second transistor TR2 may include a second buffer semiconductor pattern 212 and a plurality of second channel patterns 223. The second buffer semiconductor pattern 212 may include a second lower buffer semiconductor pattern 212b and a plurality of second upper buffer semiconductor patterns 212a. A plurality of second fin structures FS2 may include the second upper buffer semiconductor patterns 212a and the second channel patterns 223. The lower buffer semiconductor pattern 212b may contact the bottoms of the second fin structures FS2.

If the second transistor TR2 is a PMOS transistor, the second buffer semiconductor pattern 212 may include a material having a lattice constant less than that of the second channel patterns 223. Therefore, the second buffer semiconductor pattern 212 may induce a compressive stress into the second channel patterns 223 formed thereon.

A second source/drain region 206 may be provided on both sidewalls of the second fin structures FS2. A second gate dielectric layer GD2 and a second gate electrode GE2 may be formed on the second fin structures FS2. In certain embodiments, a first work function value of the first gate electrode GE1 may be different from a second work function value of the second gate electrode GE2. The second gate electrode GE2 may include a lower gate conductive layer 273 and an upper gate conductive layer 274. The lower gate conductive layer 273 may include, for example, titanium nitride, tantalum nitride, and/or tungsten nitride. The upper gate conductive layer 274 may include, for example, titanium, tantalum, and/or tungsten.

The first fin structures FS1 may be separated from each other by first device isolation structures DS1. The second fin structures FS2 may be separated from each other by second device isolation structures DS2. The first device isolation structures DS1 may include a plurality of first buffer oxide layer patterns 243, a plurality of oxidation blocking layer patterns 247, and a plurality of first gap-fill insulating layer patterns 231. On the contrary, the second device isolation patterns DS2 may include a plurality of second buffer oxide layer patterns 244 and a plurality of second gap-fill insulating layer patterns 232. Therefore, the second device isolation patterns DS2 may not include any oxidation blocking layer patterns.

In certain embodiments, the oxidation blocking layer patterns may be omitted if the first upper semiconductor patterns 211a have an oxidation rate greater than that of the first channel patterns 222. The oxidation blocking layer patterns 247 may also be omitted if the second upper buffer semiconductor patterns 212a have an oxidation rate slower than that of the second channel patterns 223.

In other example embodiment of the inventive concepts, if the second buffer semiconductor pattern 212 has an oxidation rate greater than that of the second channel patterns 223, the oxidation blocking layer patterns 247 may be formed between the buffer oxide layer patterns 244 and the gap-fill insulating layer patterns 232 in the second device isolation structures DS2.

Optionally, the buffer semiconductor pattern 111 and the channel patterns 122 may include a group 3-5 compound semiconductor or a group 2-6 compound semiconductor, respectively.

Figure 18:
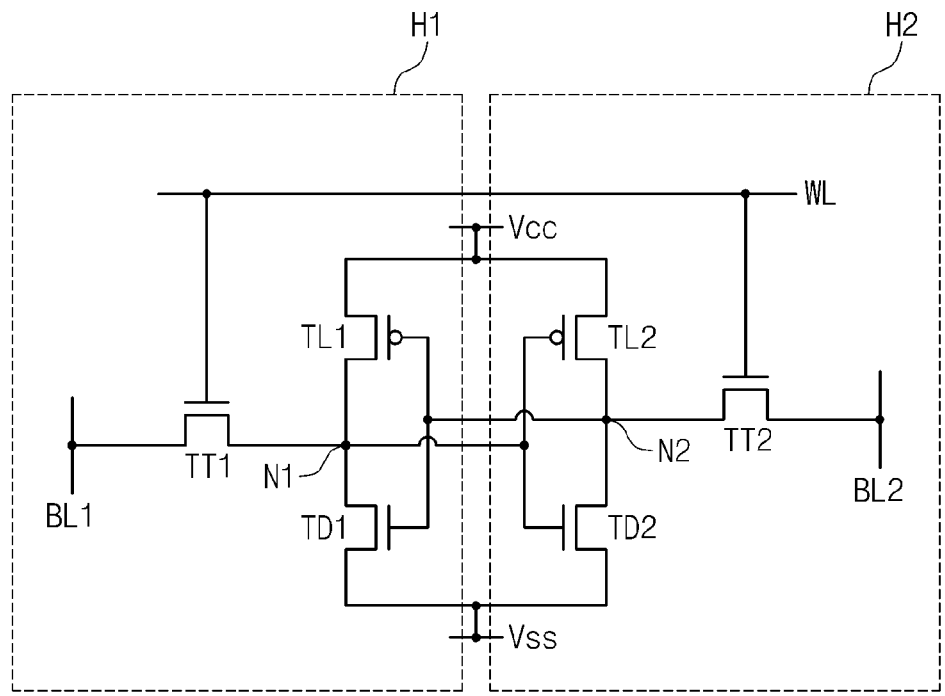
FIG. 18 is an equivalent circuit diagram illustrating a CMOS SRAM cell (Complementary metal-oxide-semiconductor Static Random Access Memory cell) including a semiconductor device according to an example embodiment of the inventive concepts.

FIG. 18 is an equivalent circuit diagram illustrating a CMOS SRAM cell including a semiconductor device according to an example embodiment of the inventive concepts. Referring to FIG. 18, the CMOS SRAM cell may include a pair of driver transistors, e.g., a first driver transistor TD1 and a second driver transistor TD2, a pair of transfer transistors, e.g., a first transfer transistor TT1 and a second transfer transistor TT2, and a pair of load transistors, e.g., a first load transistor TL1 and a second load transistor TL2. The first and second driver transistors TD1 and TD2 may be pull-down transistors. The first and second transfer transistors TT1 and TT2 may be pass transistors. The first and second load transistors TL1 and TL2 may be pull-up transistors. The first and second driver transistors TD1 and TD2 and the first and second transfer transistors TT1 and TT2 may be formed of a NMOS transistor, respectively. The first and second load transistors TL1 and TL2 may be formed of a PMOS transistor, respectively. The field effect transistor according to an example embodiment of the inventive concepts may be applied to the driver transistors, the transfer transistors, or the load transistors.

The first driver transistor TD1 and the first transfer transistor TT1 may be connected in series each other. A source region of the first driver transistor TD1 may be electrically connected to a ground line Vss and a drain region of the first transfer transistor TT1 may be electrically connected to a first bit line BL1. The second driver transistor TD2 and the second transfer transistor TT2 may be connected in series each other. A source region of the second driver transistor TD2 may be electrically connected to a ground line Vss and a drain region of the second transfer transistor TT2 may be electrically connected to a second bit line BL2.

The drain region of the first load transistor TL1 may be electrically connected to a power supply line Vcc. The source region of the first load transistor TL1 may be electrically connected to the drain region of the driver transistor TD1. The drain region of the second load transistor TL2 may be electrically connected to the power supply line Vcc. The source region of the first load transistor TL1 may be electrically connected to the drain region of the driver transistor TD2. A first node N1 may include the drain region of the first load transistor TL1, the drain region of the first driver transistor TD1, and the source region of the first transfer transistor TT1. A second node may include the drain region of the second load transistor TL2, the drain region of the second driver transistor TD2, and the source region of the second transfer transistor TT2. The gate electrode of the first driver transistor TD1 and the gate electrode of the first load transistor TL1 may be electrically connected to the second node N2. The gate electrode of the second driver transistor TD2 and the gate electrode of the second load transistor TL2 may be electrically connected to the first node N1. The gate electrodes of the first and second transfer transistors TT1 and TT2 may be electrically connected to a word line WL. A first half H1 cell may comprise the first driver transistor TD1, the first transfer transistor TT1, and the first load transistor TL1. A second half cell H2 may comprise the second driver transistor TD2, the second transfer transistor TT2, and the second load transistor TL2. The present invention may apply to not only SRAM devices but also DRAM (Dynamic Random Access Memory) or MRAM (Magnetic Random Access Memory) devices, for example.

Figure 19:
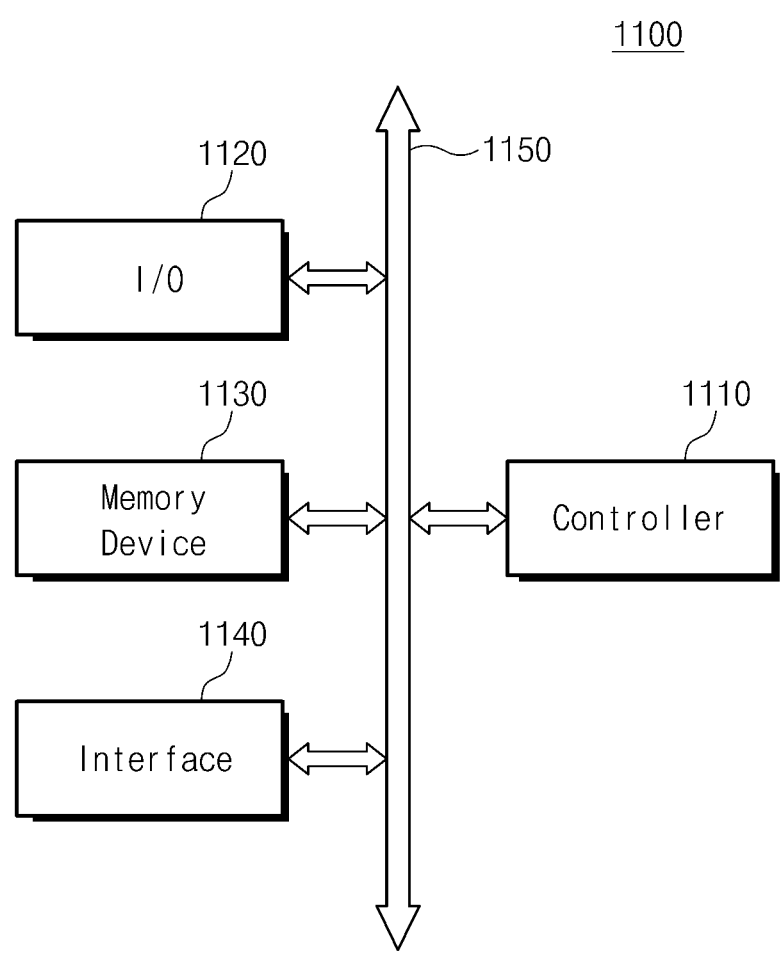
FIG. 19 is a schematic block diagram of a system including a semiconductor device according to an example embodiment of the inventive concepts.

FIG. 19 is a schematic block diagram of a system including a semiconductor device according to an example embodiment of the inventive concepts.

Referring to FIG. 19, the system 1100 may comprise a controller 1110, an input/output device 1120, a memory device 1130, an interface 1140, and a bus 1150. The controller 1110, the input/output device 1120, the memory device 1130, and the interface 1140 may communicate with each other through the bus 1150. The bus 1150 may correspond to a path over which data can be moved between system elements.

The controller 1110 may comprise a microprocessor, a digital signal processor, a microcontroller, or a similar device that can control an executive program. The input/output device 1120 may comprise a keypad, a keyboard, or a display. The memory device 1130 may not only save codes or data for executing the controller 1110 but also save data executed by the controller 1110. The memory device 1130 may comprise a semiconductor device, which has an NMOS or PMOS transistor, according to an example embodiment of the inventive concepts.

The system 1100 may be applied to a product that can transport information, e.g., a PDA (personal digital assistant), a portable computer, a web tablet, a wireless phone, a mobile phone, a digital music player, or a memory card.

Figure 20:
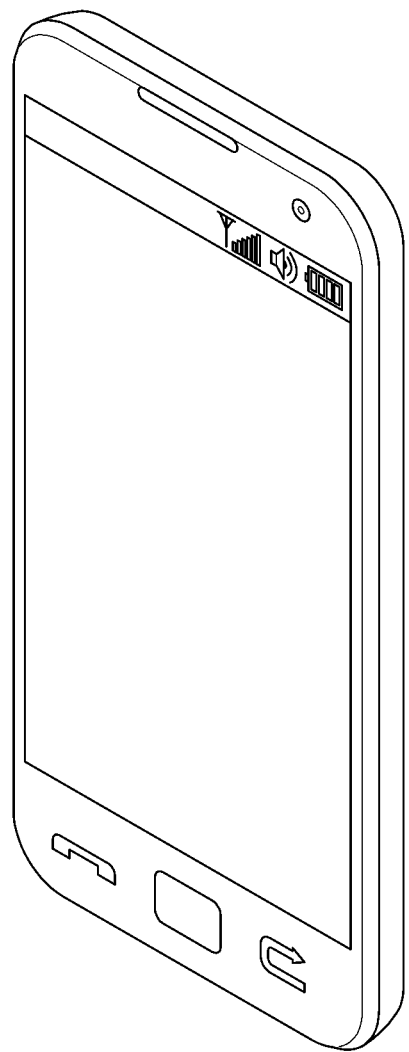
FIG. 20 is a perspective view illustrating a mobile phone which comprises a system including a semiconductor device according to an example embodiment of the inventive concepts.

FIG. 20 is a perspective view illustrating a mobile phone including the system 1100 as shown in FIG. 19. In addition, the system 1100 may be applied to other various products, e.g., a portable notebook, a MP3 player, navigation system, a solid state disk (SSD), a car, or a household appliance.

The above-disclosed subject matter is to be considered illustrative and not restrictive, and the appended claims are intended to cover all such modifications, enhancements, and other embodiments, which fall within the true spirit and scope of the inventive concepts. Thus, the scope of the inventive concepts is to be determined by the broadest permissible interpretation of the following claims and their equivalents, and shall not be restricted or limited by the foregoing detailed description.

What is claimed is:

1. A field effect transistor, comprising:
   a fin structure, having a sidewall, protruding from a substrate; and
   a device isolation structure on the substrate, the device isolation structure defining the sidewall of the fin structure,
   wherein the fin structure includes a buffer semiconductor pattern disposed on the substrate and a channel pattern disposed directly on the buffer semiconductor pattern, wherein the buffer semiconductor pattern has a lattice constant different from that of the channel pattern, wherein the device isolation structure includes a gap-fill insulating layer, and includes an oxidation blocking layer pattern disposed between the buffer semiconductor pattern and the gap-fill insulating layer, and wherein an uppermost surface of the oxidation blocking layer pattern has a level higher than that of an uppermost surface of the buffer semiconductor pattern, but lower than that of an uppermost surface of the fin structure.

2. The field effect transistor of claim 1, wherein the buffer semiconductor pattern has an oxidation rate greater than that of the channel pattern.

3. The field effect transistor of claim 1, wherein the uppermost surface of the oxidation blocking layer pattern is at substantially the same level as the uppermost surface of the gap-fill insulating layer.

4. The field effect transistor of claim 1, wherein the device isolation structure further includes a buffer oxide layer pattern between the oxidation blocking layer pattern and the buffer semiconductor pattern.

5. The field effect transistor of claim 4, wherein the oxidation blocking layer pattern has a density denser than that of the buffer oxide layer pattern.

6. The field effect transistor of claim 5, wherein the oxidation blocking layer pattern includes nitrogen (N).

7. The field effect transistor of claim 4, wherein the buffer oxide layer pattern has a density denser than that of the gap-fill insulating layer.

8. The field effect transistor of claim 4, wherein the oxidation blocking layer pattern has a thickness thinner than that of the buffer oxide layer pattern.

9. The field effect transistor of claim 4, wherein the buffer semiconductor pattern has two portions, the two portions comprising:
   an upper portion comprising a lower portion of the fin structure; and
   a lower portion disposed between the upper portion of the buffer semiconductor pattern and the substrate,
   wherein the buffer oxide layer pattern extends along the sidewall of the upper portion of the buffer semiconductor pattern and the upper surface of the lower portion of the buffer semiconductor pattern.

10. The field effect transistor of claim 1, wherein the oxidation blocking layer pattern contacts the sidewall of the buffer semiconductor pattern.

11. The field effect transistor of claim 1, further comprising:
   a gate dielectric layer on the fin structure and on an uppermost surface of the oxidation blocking layer pattern; and
   a gate electrode on the gate dielectric layer.

12. The field effect transistor of claim 11, wherein the gate dielectric layer has a high-k dielectric constant, and
   wherein the gate electrode includes metal.

13. A semiconductor device, comprising:
   a first fin structure having a first sidewall and second sidewall, the first fin structure protruding from a substrate;
   a first device isolation structure on the substrate, the first device isolation structure defining the first sidewall of the first fin structure; and
   a second device isolation structure on the substrate, the second device isolation structure defining the second sidewall of the first fin structure, wherein the first fin structure includes a first buffer semiconductor pattern disposed on the substrate and a first channel pattern disposed directly on the first buffer semiconductor pattern, wherein the first buffer semiconductor pattern has a lattice constant different from that of the channel pattern, wherein the first device isolation structure includes a first gap-fill insulating layer, and includes a first oxidation blocking layer pattern disposed between the first buffer semiconductor pattern and the first gap-fill insulating layer, and wherein an uppermost surface of the first oxidation blocking layer pattern has a level higher than that of an uppermost surface of the first buffer semiconductor pattern, and lower than that of an uppermost surface of the first fin structure.

14. The semiconductor device of claim 13, further comprising:
   at least a second fin structure, having a third sidewall and fourth sidewall, the second fin structure protruding from the substrate, wherein the third sidewall is defined by the first device isolation structure,
   wherein the second fin structure includes a second buffer semiconductor pattern disposed on the substrate and a second channel pattern disposed on the second buffer semiconductor pattern,
   wherein the second buffer semiconductor pattern has the same lattice constant as the first buffer semiconductor pattern.

15. The semiconductor device of claim 14, wherein:
   the first fin structure, second fin structure, first device isolation structure, and second device isolation structure form part of a field effect transistor.

16. A field effect transistor, comprising:
   a plurality of fin structures protruding from a substrate; and
   a plurality of device isolation structures in a plurality of trenches, each trench disposed between two of the plurality of the fin structures,
   wherein each of the plurality of fin structures includes a channel pattern disposed on the substrate and a buffer semiconductor pattern disposed between the channel pattern and the substrate, the buffer semiconductor pattern contacting the channel pattern and having an oxidation rate greater than that of the channel pattern,
   wherein each of the plurality of device isolation structures includes a buffer oxide layer pattern, an oxidation blocking layer pattern, and a gap-fill insulating layer,
   wherein the oxidation blocking layer pattern has a density denser than that of the buffer oxide layer pattern, and
   wherein the buffer oxide layer pattern has a density denser than that of the gap-fill insulating layer.

17. The field effect transistor of claim 16, wherein an uppermost surface of the oxidation blocking layer pattern has a level higher than that of an uppermost surface of the buffer semiconductor pattern, but lower than that of an uppermost surfaces of the fin structures.

18. The field effect transistor of claim 13, wherein the uppermost surface of the oxidation blocking layer pattern is at substantially the same level as the uppermost surface of the gap-fill insulating layer.

19. The field effect transistor of claim 16, wherein the oxidation blocking layer pattern includes nitrogen (N).

* * * * *